United States Patent
Wang et al.

(10) Patent No.: US 11,961,949 B2
(45) Date of Patent: Apr. 16, 2024

(54) LIGHT EMITTING DEVICE AND MANUFACTURING METHOD THEREOF, BACKLIGHT MODULE, DISPLAY PANEL AND DISPLAY DEVICE

(71) Applicant: Shanghai Tianma Micro-Electronics Co., Ltd., Shanghai (CN)

(72) Inventors: Lihua Wang, Shanghai (CN); Xiaoping Sun, Shanghai (CN); Conghua Ma, Shanghai (CN); Qiang Dong, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 428 days.

(21) Appl. No.: 17/011,846

(22) Filed: Sep. 3, 2020

(65) Prior Publication Data
US 2021/0376209 A1 Dec. 2, 2021

(30) Foreign Application Priority Data
Jun. 2, 2020 (CN) .......................... 202010491514.7

(51) Int. Cl.
*H01L 27/15* (2006.01)
*G02F 1/13357* (2006.01)
(Continued)

(52) U.S. Cl.
CPC ........ *H01L 33/62* (2013.01); *G02F 1/133603* (2013.01); *H01L 33/0093* (2020.05)

(58) Field of Classification Search
CPC . H01L 33/62; H01L 33/0093; H01L 25/0753; H01L 25/167; H01L 27/156;
(Continued)

(56) References Cited

U.S. PATENT DOCUMENTS

2012/0256814 A1* 10/2012 Ootorii ................ G09G 3/3208
345/82
2020/0366062 A1* 11/2020 Iguchi ................ H01S 5/04256
(Continued)

FOREIGN PATENT DOCUMENTS

CN 102568390 A 7/2012
CN 104575380 A 4/2015
(Continued)

*Primary Examiner* — Ismail A Muse
(74) *Attorney, Agent, or Firm* — ALSTON & BIRD LLP

(57) ABSTRACT

Provided are a light emitting device and manufacturing method thereof, a backlight module, a display panel and a display device. The manufacturing method includes: providing a substrate; forming a circuit layer on a side of the substrate; providing at least one switching element and at least one light emitting element; and electrically connecting the switching element and the light emitting element to the circuit layer. The circuit layer includes a first power signal line, a second power signal line, and a pulse width modulation signal line; the switching element includes a control terminal, a first terminal and a second terminal; the light emitting element is electrically connected between the first terminal and the first power signal line, or the light emitting element is electrically connected between the second terminal and the second power signal line.

13 Claims, 16 Drawing Sheets

(51) Int. Cl.
*H01L 21/12* (2006.01)
*H01L 29/26* (2006.01)
*H01L 33/00* (2010.01)
*H01L 33/62* (2010.01)

(58) Field of Classification Search
CPC ......... G02F 1/133603; G02F 1/133612; H05B 45/30; G09G 3/32
See application file for complete search history.

(56) References Cited

U.S. PATENT DOCUMENTS

| | | | |
|---|---|---|---|
| 2021/0183833 A1* | 6/2021 | Hu | H01L 33/62 |
| 2022/0068193 A1* | 3/2022 | Wang | G09G 3/3233 |
| 2022/0101781 A1* | 3/2022 | Baumheinrich | G09G 3/32 |
| 2022/0254304 A1* | 8/2022 | Baumheinrich | G09G 3/32 |

FOREIGN PATENT DOCUMENTS

| | | |
|---|---|---|
| CN | 206164908 U | 5/2017 |
| CN | 207397671 U | 5/2018 |
| CN | 110391261 A | 10/2019 |

\* cited by examiner

LIGHT EMITTING DEVICE AND MANUFACTURING METHOD THEREOF, BACKLIGHT MODULE, DISPLAY PANEL AND DISPLAY DEVICE

CROSS-REFERENCE TO RELATED APPLICATIONS

This application claims priority to Chinese patent application No. CN202010491514.7 filed with CNIPA on Jun. 2, 2020, the disclosure of which is incorporated herein by reference in its entirety.

TECHNICAL FIELD

The present disclosure relates to the field of light emitting and display technologies, in particular to a light emitting device and manufacturing method thereof, a backlight module, a display panel and a display device.

BACKGROUND

Light emitting in display technologies has placed mini LEDs and micro LEDs into the focus of attention in mainstream microminiature light emitting diode display screens by most manufacturers, because of the advantages of high brightness, high contrast, high resolution, and high color saturation, etc.

Currently, a display device or a light emitting device including mini LEDs or micro LEDs display includes a large number of small-sized light emitting diode (LED) arrays, methods for driving the LEDs include an active matrix drive technique and a passive matrix drive technique. For the passive matrix drive LED array, the manufacturing cost is high; for the active matrix drive LED array, the conventional driving method uses voltage controlled current to drive, which involves difficult greyscale control, resulting in high power consumption and high cost.

SUMMARY

The present disclosure provides a light emitting device and manufacturing method thereof, a backlight module, a display panel and a display device. A new manufacturing method of a light emitting device is provided.

In a first aspect, embodiments of the present disclosure provide a manufacturing method of a light emitting device. The manufacturing method includes steps: a substrate is provided, a circuit layer is formed on a side of the substrate, at least one switching element and at least one light emitting element are provided; and the switching element and the light emitting element are electrically connected to the circuit layer. The circuit layer includes a first power signal line, a second power signal line, and a pulse width modulation signal line; the switching element includes a control terminal, a first terminal and a second terminal; the control terminal is electrically connected to the pulse width modulation signal line, the first terminal is electrically connected to the first power signal line, and the second terminal is electrically connected to the second power signal line; and the light emitting element is electrically connected between the first terminal and the first power signal line, or the light emitting element is electrically connected between the second terminal and the second power signal line.

In a second aspect, the embodiments of the present disclosure further provide a light emitting device, which is formed by the manufacturing method of a light emitting device in the first aspect. The light emitting device includes a substrate, a circuit layer, and at least one switching element and at least one light emitting element. The circuit layer is formed on one side of the substrate, where the circuit layer includes a first power signal line, a second power signal line and a pulse width modulation signal line. The switching element and the light emitting element are electrically connected to the circuit layer. The switching element includes a control terminal, a first terminal and a second terminal; the control terminal is electrically connected to the pulse width modulation signal line, the first terminal is electrically connected to the first power signal line, and the second terminal is electrically connected to the second power signal line. The light emitting element is electrically connected between the first terminal and the first power signal line, or the light emitting element is electrically connected between the second terminal and the second power signal line.

In a third aspect, the embodiments of the present disclosure further provide a backlight module. The backlight module includes any one light emitting device provided in the second aspect.

In a fourth aspect, embodiments of the present disclosure further provide a display device. The display device includes the backlight module provided in the third aspect, and further includes a display panel. The display panel is disposed on a light emitting side of the backlight module.

In a fifth aspect, the embodiments of the present disclosure further provide a display device, which includes any one light emitting device provided in the second aspect. The display device further includes an opposing substrate. The opposing substrate is disposed opposite to the light emitting device. In a sixth aspect, embodiments of the present disclosure further provide a display device, which includes the display panel provided in the fifth aspect. The display device further includes a protective cover. The protective cover is disposed on a light emitting side of the display panel.

Figure 35:
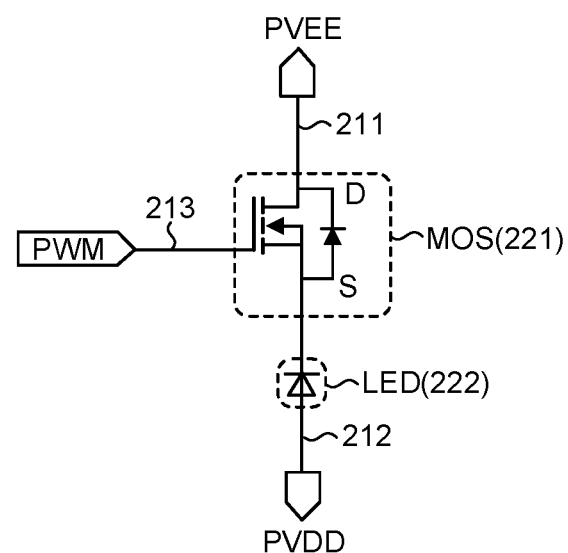
Figure 36:
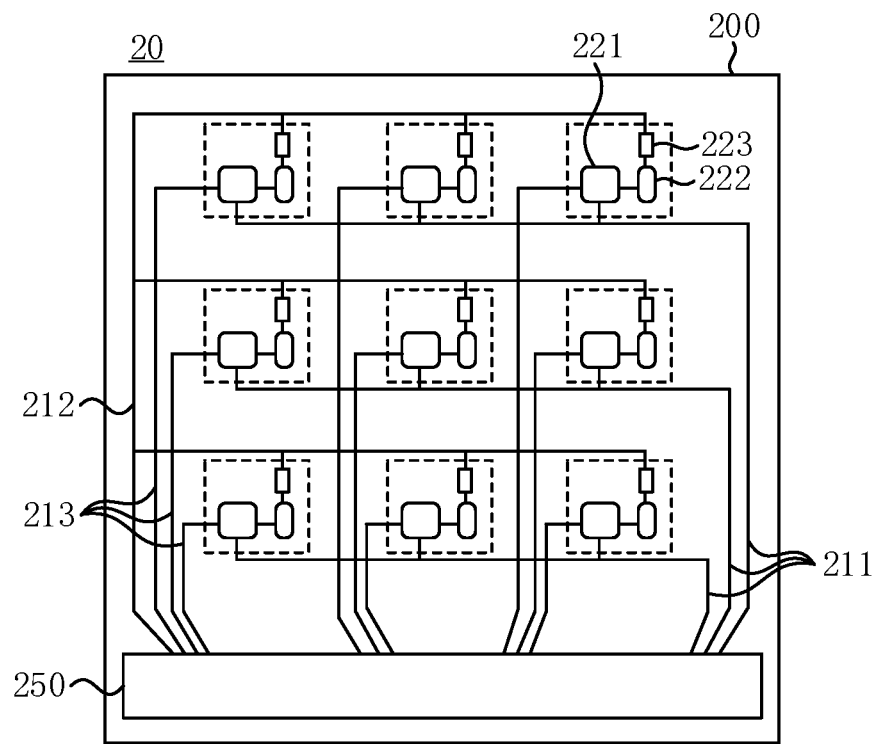
Figure 37:
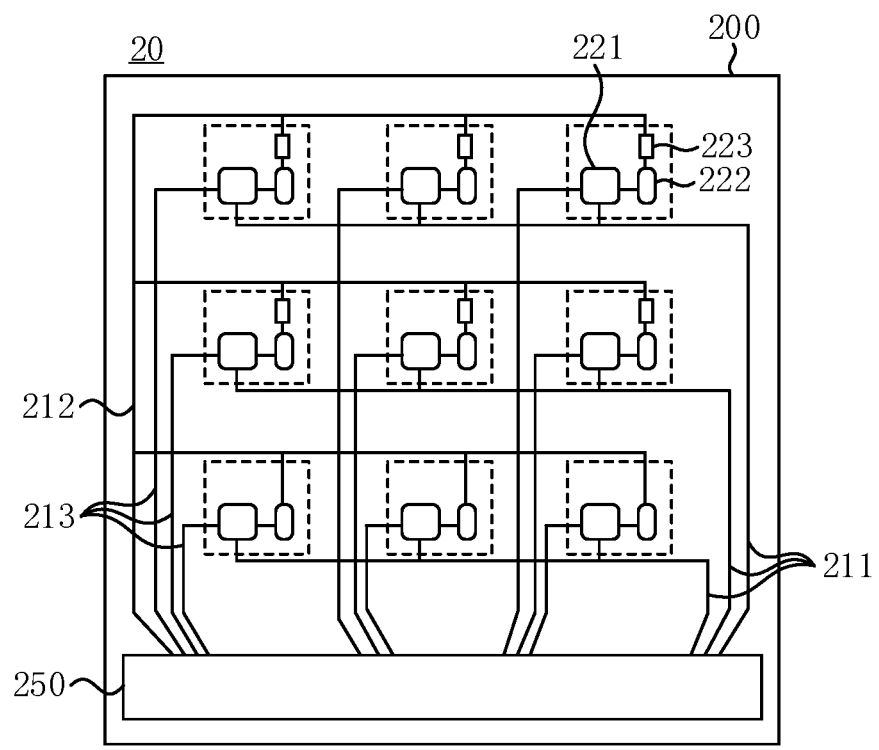
Figure 38:
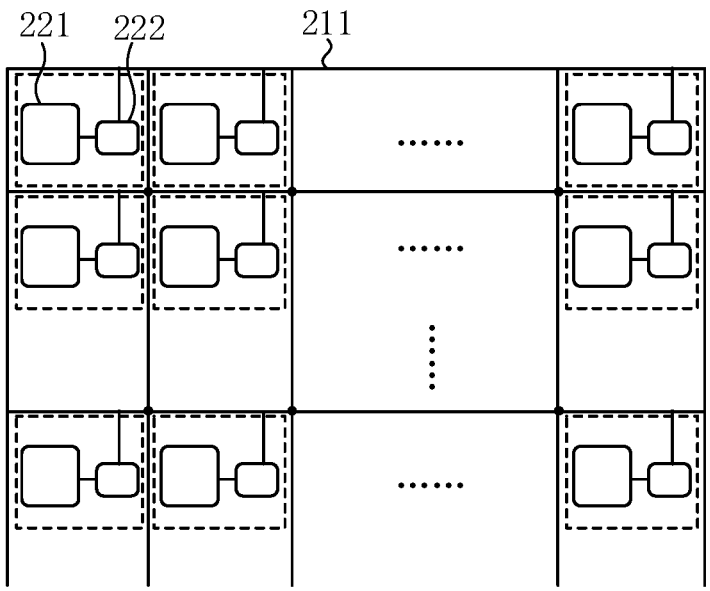
Figure 39:
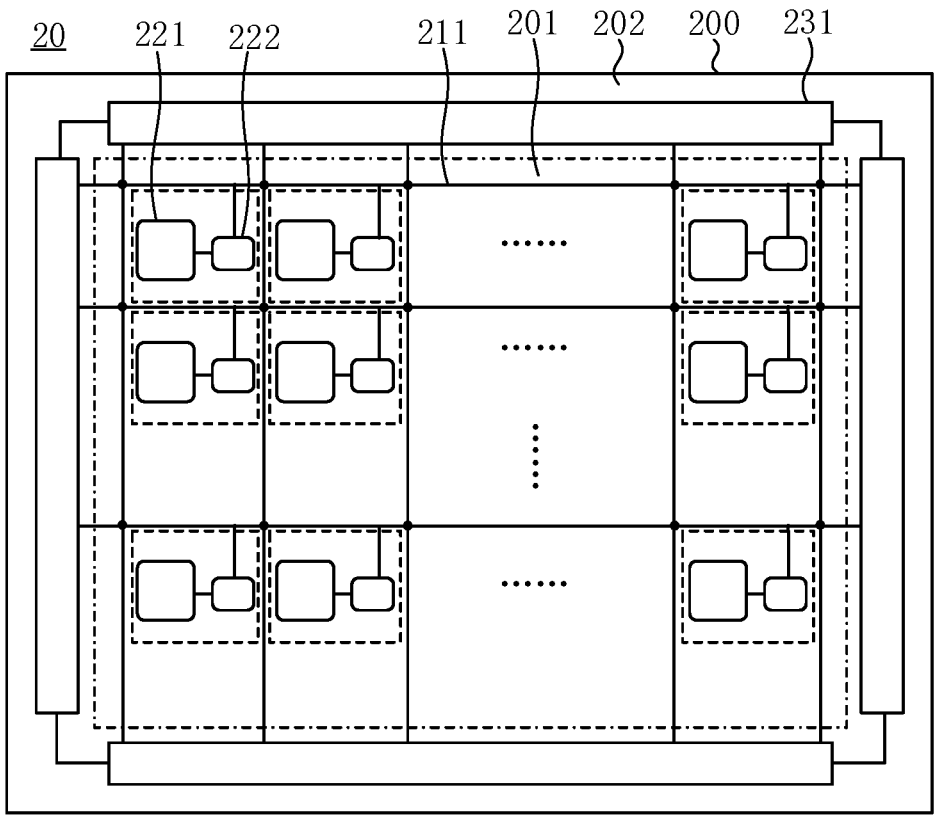
Figure 40:
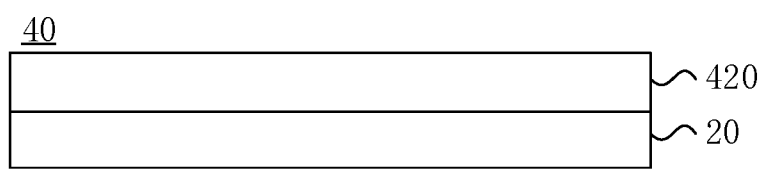
Figure 41:
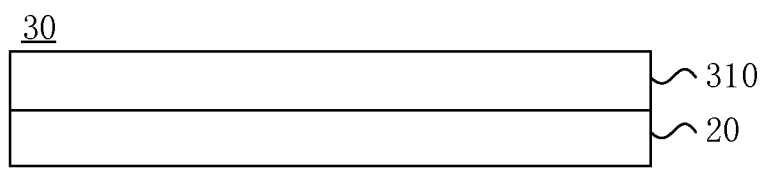
Figure 42:
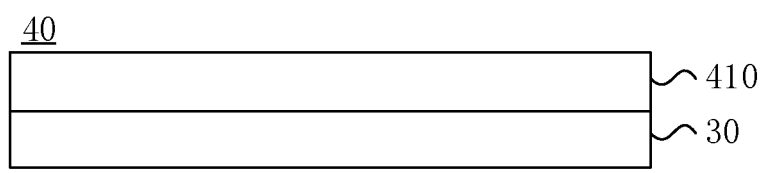

Fogs 30 to 34 are layout diagrams of a multi-film layer stack corresponding to a circuit in a single zone according to an embodiment of manufacturing method in the present disclosure;

FIG. 35 shows another zone circuit according to an embodiment of the present disclosure;

FIG. 36 is a planar block diagram of another light emitting device according to an embodiment of the present disclosure;

FIG. 37 is a planar block diagram of another light emitting device according to an embodiment of the present disclosure;

FIG. 38 is a planar block diagram of another light emitting device according to an embodiment of the present disclosure;

FIG. 39 is a planar block diagram of another light emitting device according to an embodiment of the present disclosure;

FIG. 40 is a display device of passive light emitting according to an embodiment of the present disclosure;

FIG. 41 is a display panel of active light emitting according to an embodiment of the present disclosure; and FIG. 42 is a display device of passive light emitting according to an embodiment of the present disclosure.

DETAILED DESCRIPTION

Hereinafter the present disclosure will be further described in detail with reference to the drawings and embodiments It is to be understood that the specific embodiments set forth below are intended to illustrate and not to limit the present disclosure. Additionally, it is to be noted that, for ease of description, only part, not all, of the structures related to the present disclosure are illustrated in the drawings.

In the related art, the mini LEDs or the micro LEDs, which form the light emitting device, is used for display and is also used as a backlight of a passive light emitting display device. In an edge-lit backlight structure, a LED strip is used as a backlight source for LED backlight, and an optical film such as a light guide plate is used for implementing brightness spreading and ensuring high backlight brightness, so as to form a structure of a conventional backlight module. With the development of display technology, in order to implement higher display contrast, a direct-lit zone backlight structure can be used for implementing accurate regulation of backlight brightness of each zone. The existing direct-lit zone backlight structure can generally use two drive modes: a passive matrix (PM) drive mode and an active matrix (AM) drive mode.

Figure 1:
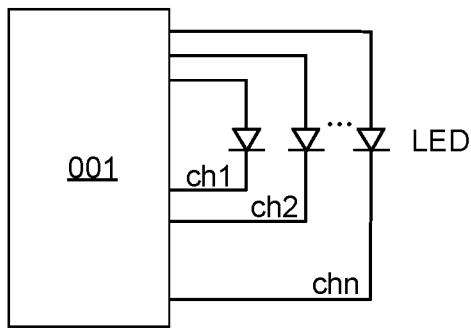
FIG. 1 is a schematic diagram of a drive circuit in the related art.

Exemplarily, FIG. 1 is a schematic diagram of a drive circuit in the related art, which shows a circuit structure of a passive matrix drive mode. Referring to FIG. 1, one LED drive circuit needs to be disposed for each string of LEDs (shown by ch1, ch2, . . . , ch-n in FIG. 1), thereby resulting in a large number of drive circuits in a PM drive chip 001, a limited number of zones, and high cost.

Figure 2:
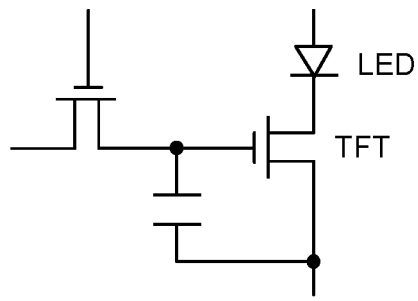
FIG. 2 is a schematic diagram of another drive circuit in the related art.

Exemplarily, FIG. 2 is a schematic diagram of another drive circuit in the related art, which shows a circuit structure of an active matrix drive mode. Referring to FIG. 2, in the AM mode, a manner of the voltage controlling the current is limited by the characteristic curve of the transistor (shown as TFT in FIG. 2), and the greyscale control is difficult. The TFT component is used as a drive transistor, the process is complex, the uniformity of the component is poor, and a complex threshold compensation circuit or an external compensation method is required. In addition, the power consumption of the drive mode is high due to the large power consumption of the TFT drive transistor.

In view of the above, embodiments of the present disclosure provide a light emitting device, a manufacturing method of the light emitting device, a backlight module, a display panel and a display device, which improve the forming process of the light emitting device and the drive mode of the light emitting element.

The following exemplarily describes a light emitting device, a manufacturing method of the light emitting device, a backlight module, a display panel and a display device provided embodiments of the present disclosure with references to FIG. 3 to FIG. 42.

Figure 3:
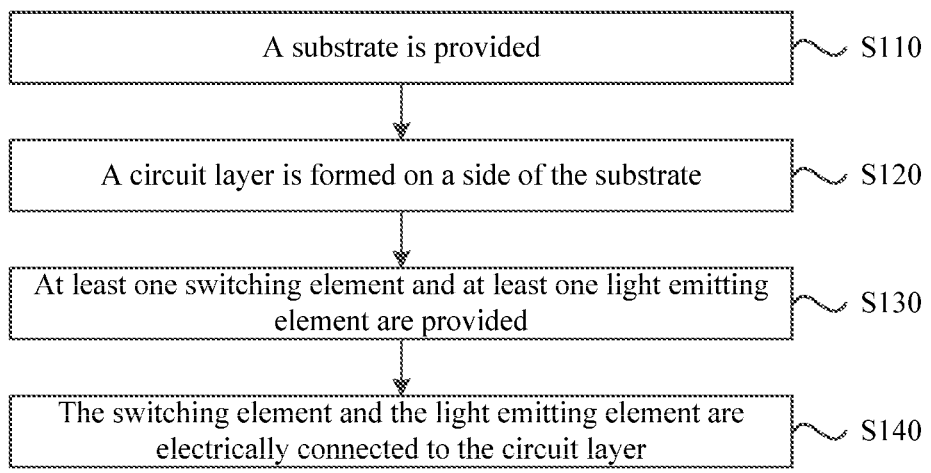
FIG. 3 is a flowchart illustrating a manufacturing method of a light emitting device according to an embodiment of the present disclosure.

Exemplarily, FIG. 3 is a flowchart illustrating a manufacturing method of a light emitting device according to an embodiment of the present disclosure. Referring to FIG. 3, the manufacturing method of the light emitting device includes steps described below.

In S110, a substrate is provided.

The substrate has a function of supporting and protecting a circuit layer formed on the substrate. Exemplarily, the substrate may include a glass substrate, a printed circuit board substrate, or a flexible circuit board substrate, and may include a substrate of other materials known to those skilled in the art.

In an embodiment, when a glass substrate is used as the substrate, the light emitting device can be prepared by using the process of a panel factory, the manufacturing cost of the light emitting device can be reduced, a larger number of light emitting devices can be formed on the substrate, and the utilization rate of the substrate is increased.

Exemplarily, this step may include: providing a substrate meeting requirements of process dimensions, and cleaning and drying the substrate, so as to prepare for forming a circuit layer in S120.

Figure 4:
FIG. 4 is the structure of the light emitting device after S110 is completed according to the manufacturing method shown in FIG. 3.

Exemplarily, FIG. 4 is the structure of the light emitting device after S110 is completed according to the manufacturing method shown in FIG. 3. Referring to FIG. 4, at least one side surface of the substrate 200 is flat in preparation for forming a circuit layer on the side surface in S120.

In S130, a circuit layer is formed on a side of the substrate.

The circuit layer includes signal lines, which are described in detail below.

Exemplarily, this step may include forming the circuit layer by using a conductive layer of metal, an organic film layer, an inorganic film layer or the like, and using a process such as evaporation or sputtering.

Figure 5:
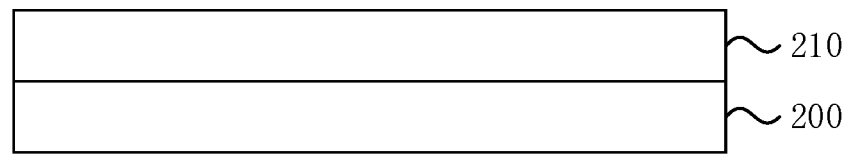
FIG. 5 is the structure after S120 is completed according to the manufacturing method shown in FIG. 3.

Exemplarily, FIG. 5 is the structure of the light emitting device after S120 is completed according to the manufacturing method shown in FIG. 3. Referring to FIG. 5, after this step is finished, a circuit layer 210 is formed on one side surface of the substrate 200.

In S130, at least one switching element and at least one light emitting element are provided.

The switching element is used for switching control, and the light emitting element is used for emitting light.

Exemplarily, the switching element may be a junction field effect transistor (JFET), a metal-oxide semiconductor field effect transistor (MOS-FET), or a thin film transistor (TFT); the switching element may be an LED, such as a mini LED or micro LED, or other type of light emitting element known to those skilled in the art.

Exemplarily, this step may include providing a switching element having connection pins and a light emitting element having connection pins.

In S140, the switching element and the light emitting element are electrically connected to the circuit layer.

The switching element may be electrically connected to the light emitting element through a signal line in the circuit layer, thereby controlling the light emitting element to emit light or not and controlling light emitting brightness.

Exemplarily, this step may include: electrically connecting the switching element to the circuit layer, and electrically connecting the light emitting element to the circuit layer.

Figure 6:
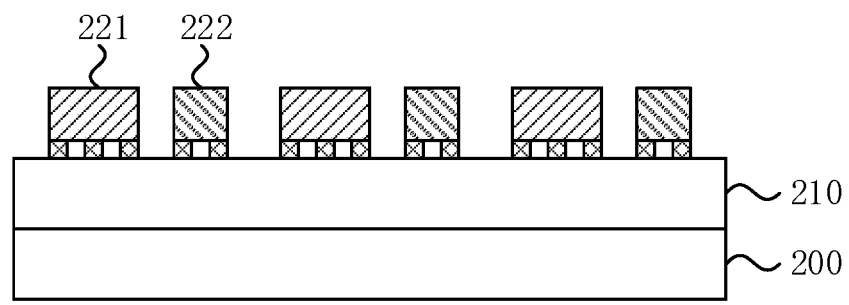
FIG. 6 is the structure after S140 is completed according to the manufacturing method shown in FIG. 3.

Exemplarily, FIG. 6 is the structure of the light emitting device after S140 is completed according to the manufacturing method shown in FIG. 3. Referring to FIG. 6, the switching element 221 and the light emitting element 222 each are electrically connected to the circuit layer 210.

Thus, a light emitting device is formed. In the above-mentioned flow, the circuit layer including signal lines is formed only on one side surface of the substrate and the switching element is not formed; the switching element and the light emitting element are additionally provided and electrically connected to the circuit layer, so that the process flow is simple and the cost is low. Meanwhile, the circuit layer may include a conductor layer, an organic film layer and an inorganic film layer, and the foregoing film layers can be formed by using the existing evaporation or sputtering equipment in a panel factory, so that the manufacturing method of the light emitting device can be implemented in the panel factory.

In other embodiments, when the circuit layer includes a copper layer, the copper layer may be formed by a process of evaporation or sputtering, or may be formed by a process of electrochemical copper plating, which is not limited in this embodiment of the present disclosure.

Figure 7:
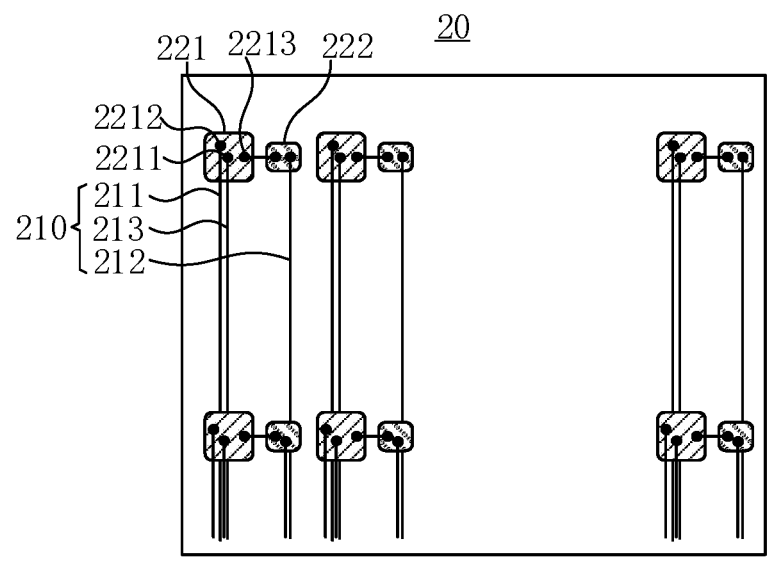
FIG. 7 is a planar view of the structure of the light emitting device according to an embodiment of the present disclosure.

Exemplarily, FIG. 7 is a planar view of the structure of the light emitting device according to an embodiment of the present disclosure. In conjunction with FIG. 6 and FIG. 7, in the light emitting device 20, the circuit layer 210 includes a first power signal line 211, a second power signal line 212, and a pulse width modulation signal line 213; the switching element 221 includes a control terminal 2211, a first terminal 2212 and a second terminal 2213; the control terminal 2211 is electrically connected to the pulse width modulation signal line 213, the first terminal 2212 is electrically connected to the first power signal line 211, and the second terminal 2213 is electrically connected to the second power signal line 212; the light emitting element 222 is electrically connected between the first terminal 2212 and the first power signal line 211 (as show in FIG. 7), or the light emitting element 212 is electrically connected between the second terminal 2213 and the second power signal line 212.

The electrical connection may include a direct electrical connection and an indirect electrical connection. In the indirect electrical connection, another electrical element, such as a switching element or a storage element, may also be disposed between two electrically connected components or terminals, which will be described in detail below.

The first power signal line 211 and the second power signal line 212 are used for transmitting power signals, respectively, so that a potential difference is generated between two terminals of the light emitting element 222, and the light emitting element 222 can be driven to emit light. The pulse width modulation (PWM) signal line 213 is used for transmitting a PWM signal, and a high or low level of the PWM signal can control the switching element 221 electrically connected to the PWM signal line to be in an on or off state. When the switching element 221 is turned on, the light emitting element 222 electrically connected to the switching element 221 is powered on, and when the switching element 221 is turned off, the light-emitting element 222 electrically connected to the switching element 221 is powered off; based on this, the time during which the switching element 221 is on is proportional to the light emitting brightness of the light emitting element 222. The longer the time during which the switching element 221 is on, the brighter the light emitting brightness of the light emitting element 222. The brightness (that is, display greyscale) of the light emitting element 222 is adjusted by adjusting the pulse width transmitted to the control terminal of the switching element 221. Therefore, the adjustment of different display greyscales can be implemented by adjusting different pulse widths (that is, duty cycles) of the PWM. In this way, the greyscale control is less difficult, the adjustment manner is simple, and the power consumption is low; at the same time, multiple zones can be implemented, and the cost is low.

It is understandable that a switching element 221 and at least one light emitting element 222 electrically connected to the switching element 221 and controlled to be driven can be regarded as a "zone", which may also be referred to as a light emitting zone or a backlight zone herein.

Continuing to refer to FIG. 7, each zone independently leads to a pulse width modulation signal line 213 (also called a drive signal line 213), and each pulse width modulation signal line 213 needs to input a separate PWM drive signal; one switching element needs to be disposed on each zone, the switching element may be one MOS chip, and the MOS chip is electrically connected to one LED. The MOS chip and the LEDs may be die-bonded on the substrate meanwhile.

It should be noted that FIG. 7 exemplarily shows that only one switching element 221 and one light emitting element 222 are dispose in one zone. In other embodiments, another number of switching elements 221 and light emitting elements 222 may be disposed on one zone. In different zones of a same light emitting device 20, the number of switching elements 221 and the number of light emitting elements 222 may be the same or different, which can be set according to the requirements of the light emitting device and the manufacturing method thereof, for example, one switching element 221 is disposed on one zone, or at least two light emitting elements 222 electrically connected in series are disposed on one zone, or at least two light emitting elements 222 electrically connected in parallel are disposed on one zone, or at least two switching elements 221 are disposed on one zone and control terminals of the at least two switching elements are connected to a same PWM drive signal, etc., which is not limited in the embodiments of the present disclosure.

Figure 8:
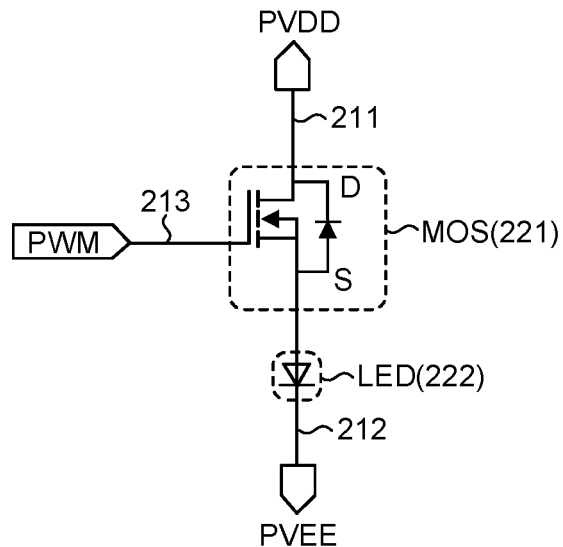
FIG. 8 is a schematic diagram of a zone circuit according to an embodiment of the present disclosure.
Figure 9:
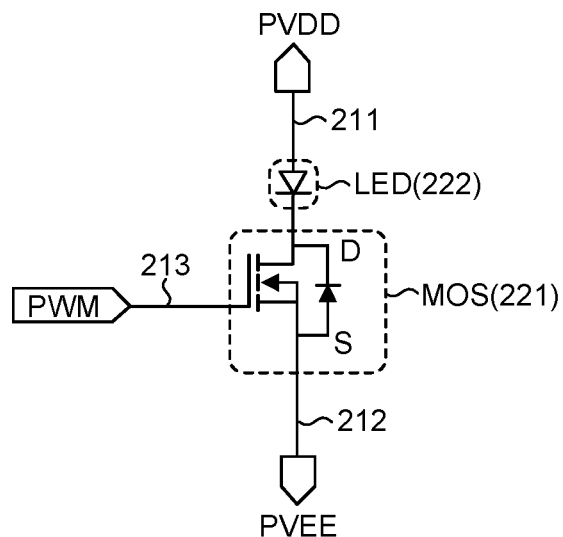
FIG. 9 is a schematic diagram of another zone circuit according to an embodiment of the present disclosure.

In conjunction with FIG. 8 and FIG. 9, the structure of the zone circuit provided by the embodiment of the present disclosure will be exemplarily described herein.

Exemplarily, FIG. 8 is a schematic diagram of a zone circuit according to an embodiment of the present disclosure. Referring to FIG. 8, the first power signal line 211 is used for transmitting a first power signal PVDD, the second power signal line 212 is used for transmitting a second power signal PVEE, the pulse width modulation signal line 213 is used for transmitting a pulse width modulation signal PWM, the light element 222 is electrically connected between the switching element 221 and the second power signal line 212.

Exemplarily, FIG. 9 is a schematic diagram of another zone circuit according to an embodiment of the present disclosure. Referring to FIG. 9, the same parts as those in FIG. 8 will not be repeated. The difference is that: the light emitting element 222 is not electrically connected between the switching element 221 and the second power signal line 212, but is electrically connected between the first power signal line 211 and the switching element 221.

In other embodiments, the pulse width modulation signal PWM may also be transmitted to the control terminal of the switching element 221 after passing through other circuit elements. For example, the pulse width modulation signal PWM needs to pass through another MOS transistor and then is transmitted from the pulse width modulation signal line 213 to the control terminal of the switching element 221; or, other circuit elements may be disposed on the second power signal line 212, for example, another circuit element with a switching function electrically connected to the light emitting element in series is disposed on the second power signal line 212.

In addition, in other embodiments, other circuit elements known to those skilled in the art may be disposed in the zone circuit structure to meet the requirement of using the pulse width modulation signal PWM to control the switching duration ratio of the switching element 221, so as to use the duty cycle of the pulse width modulation signal PWM to control the display greyscale of the light emitting element 222, which is not described in detail and is not limited in the embodiment of the present disclosure.

It should be noted that FIG. 3 only exemplarily shows that S120 is performed after S120, but do not constitute a limitation on the manufacturing method of the light emitting provided by embodiments of the present disclosure. In other embodiments, S130 may also be executed before S110 and S120, which is not limited in the embodiment of the present disclosure.

Figure 10:
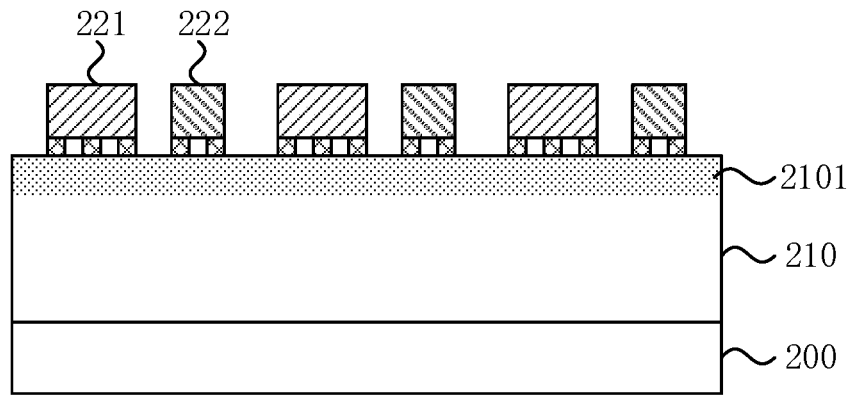
FIG. 10 is the cross-sectional view of another light emitting device according to an embodiment of the present disclosure.

In an embodiment, FIG. 10 is a cross-sectional view of another light emitting device according to an embodiment of the present disclosure. On the basis of FIG. 6, referring to FIG. 10, the circuit layer 210 includes a binding layer 2101 away from the substrate 200. Based on this, S140 in FIG. 3 may include: binding and electrically connecting the switching element to the binding layer, and binding and electrically connecting the light emitting element to the binding layer.

The binding can also be referred to as die-bonding or welding. The switching element and the light emitting element can be bound synchronously, or be bound separately and independently, which is not limited in the embodiments of the present disclosure.

Exemplarily, this step may specifically include: brushing tin on the surface of the binding layer, die attaching, reflow soldering, cleaning, molding, and curing. In this way, while ensuring a good electrical connection, the binding reliability can be improved, which is beneficial to ensuring that the light emitting device has a relatively stable structure and is beneficial to prolonging its service life.

In an embodiment, in order to shorten the time consumed for binding, the switching element and the light emitting element may be synchronously bound. To achieve this goal, electrically connecting the switching element and the light emitting element to the circuit layer may include: electrically connecting the switching element and the light emitting element to the circuit layer by using a transfer manner.

Through the transfer manner, a large number of switching elements and light emitting elements can be simultaneously transferred to the circuit layer of the substrate at one time, thereby saving time.

Figure 11:
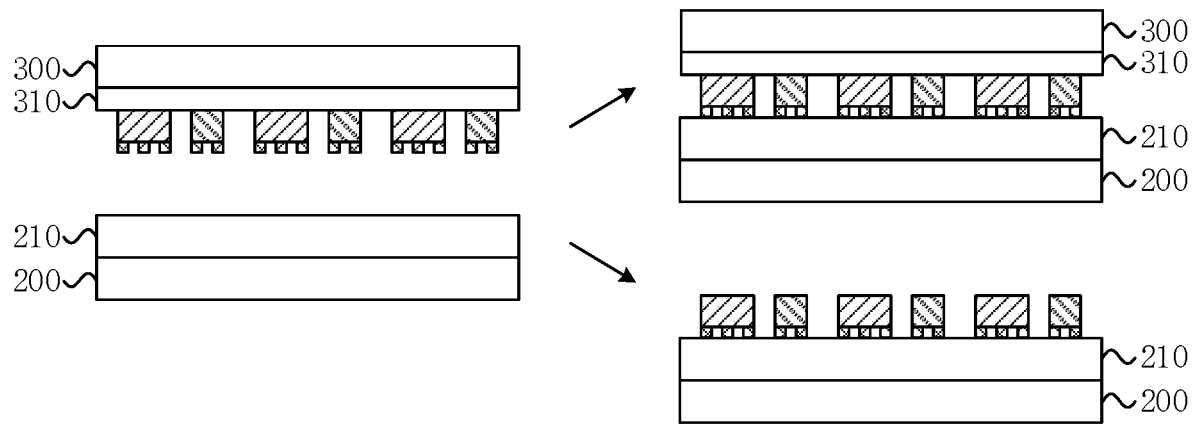
FIG. 11 is the cross-sectional view of another light emitting device according to an embodiment of the present disclosure.

Exemplarily, FIG. 11 is a cross-sectional view of another light emitting device according to an embodiment of the present disclosure. In FIG. 11, structures of a base substrate side and a transfer substrate side before transferring, and the structures of two different light emitting devices after transferring are shown. Referring to FIG. 11, the circuit layer 210 is formed on the surface of the base substrate 200 before transferring. On the opposite side, the light emitting element and the switching element are fixed by an adhesive layer 310 on a side of the transfer substrate 300 facing the base substrate 200; exemplarily, the adhesive layer 310 may be a PI layer or a hot melt adhesive layer. During the transfer process, the transfer substrate 300 gradually approaches the substrate 200 until the light emitting element and the switching element are contact with the circuit layer and are electrically connected to the circuit layer. After the transfer, the transfer substrate 300 and the adhesive layer 310 can be retained, and the transfer substrate 300 can be reused as a packaging substrate, as shown in an upper right diagram in FIG. 11; or, the transfer substrate 300 and the adhesive layer 310 can be removed, and only the switching element and the light emitting element are remained on the circuit layer, as shown in the lower right diagram in FIG. 11.

In other embodiments, other methods known to those skilled in the art can also be used to implement electrically connecting the switching element and the light emitting element to the circuit layer, which is not described or limited in the embodiments of the present disclosure.

In an embodiment, the circuit layer further includes at least one metal layer formed between the binding layer and the substrate; each of the first power signal line, the second power signal line, and the pulse width modulation signal line is formed in any one of the metal layer.

The resistance value of the metal layer is relatively small, when metal layer is used for forming a signal line, the voltage drop on the signal line is relatively small, so that the signal difference between a proximal end and a distal end of the signal line is relatively small, which is beneficial to making the light emitting brightness more consistent on the entire light emitting surface of the light emitting device, thereby implementing a better light emitting effect.

A number of layers of the metal layer can be set according to the requirements of the light emitting device and the manufacturing method thereof, and the number can be one, two, three or more, which is not limited in the embodiment of the present disclosure.

In conjunction with FIG. 12 to FIG. 16, taking the film structure of a single zone as an example, the manner that the signal lines in the circuit layer are arranged in the metal layer will be described exemplarily.

Figure 12:
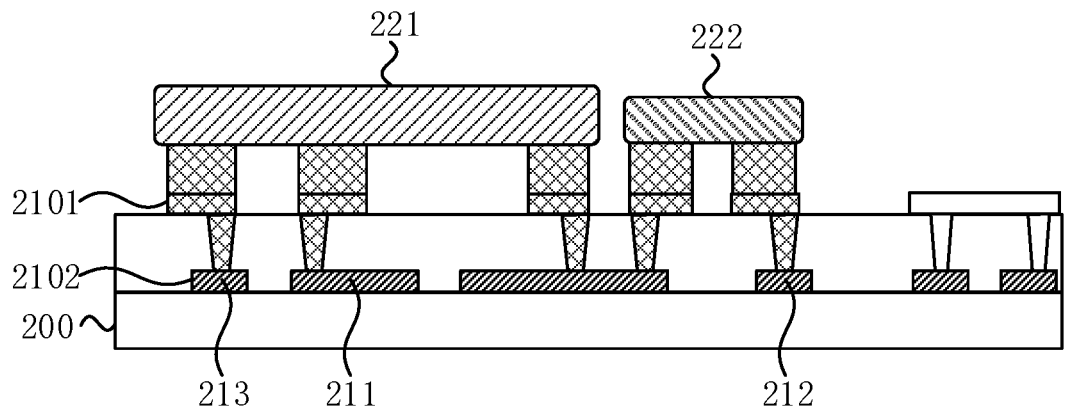
FIG. 12 is the cross-sectional view of another light emitting device according to an embodiment of the present disclosure.

FIG. 12 is a cross-sectional view of another light emitting device according to an embodiment of the present disclosure. In conjunction with FIG. 10 and FIG. 12, the circuit layer 210 includes the metal layer 2102. The first power signal line 211, the second power signal line 212, and the pulse width modulation signal line 213 each are formed in the metal layer 2102. By this arrangement, three types of signal lines can be formed in a same process, use a same material, and use a same film layer, thereby saving manufacturing procedure and making the process simpler.

Figure 13:
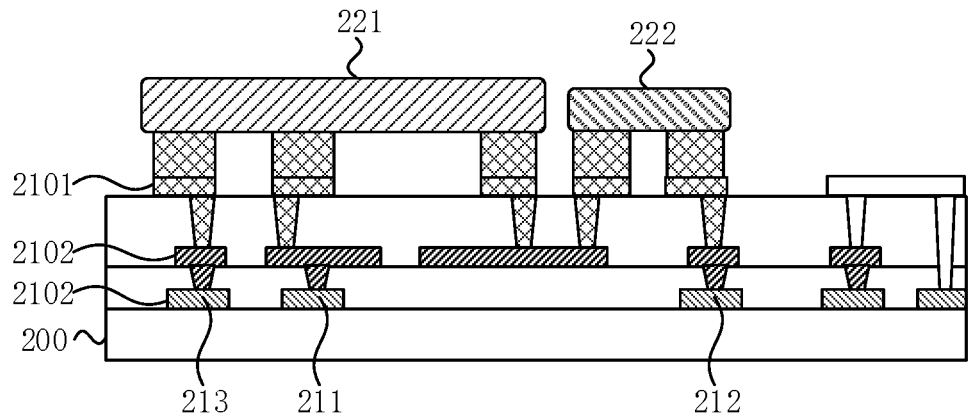
FIG. 13 is the cross-sectional view of another light emitting device according to an embodiment of the present disclosure.

FIG. 13 is a cross-sectional view of another light emitting device according to an embodiment of the present disclosure. In conjunction with FIG. 10 and FIG. 13, the circuit layer 210 includes two metal layers 2102. The first power signal line 211, the second power signal line 212, and the pulse width modulation signal line 213 each are formed in a metal layer 2102 close to the substrate 200. In other embodiments, the first power signal line 211, the second power signal line 212, and the pulse width modulation signal line 213 can also be formed in a metal layer 2102 away from the substrate 200.

Figure 14:
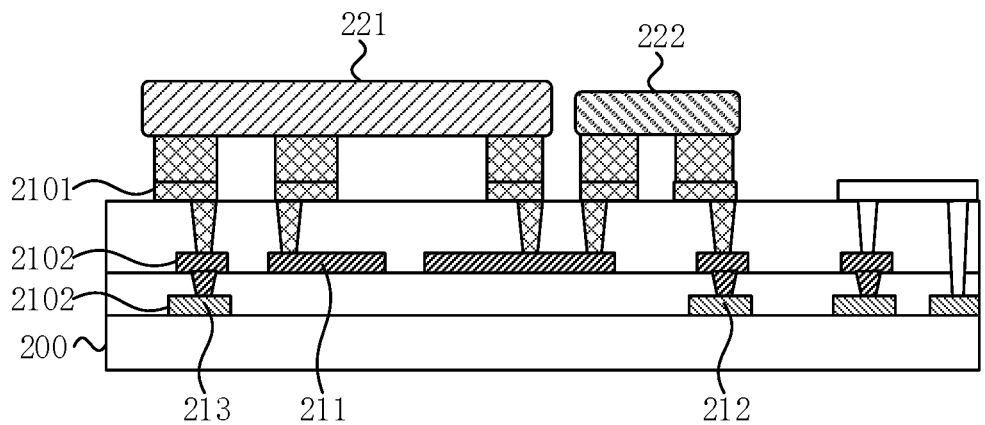
FIG. 14 is the cross-sectional view of another light emitting device according to an embodiment of the present disclosure.

Exemplarily, FIG. 14 is a cross-sectional view of another light emitting device according to an embodiment of the present disclosure. In conjunction with FIG. 10 and FIG. 14, the circuit layer 210 includes two metal layers 2102, the pulse width modulation signal line 213 and the second power signal line 212 are formed in a metal layer 2102 close to the substrate 200, and the first power signal line 211 is formed in a metal layer 2102 away from the substrate 200. In other embodiments, the first power signal line 211, the second power signal line 212, and the pulse width modulation signal line 213 can also be disposed in the two metal layers 2102 in other manners.

Exemplarily, corresponding to the cross-sectional diagram of the light emitting device shown in FIG. 14, S120 in FIG. 1 may include: sequentially forming a first metal layer, a first insulating layer, a second metal layer, a second insulating layer and a binding layer on one side of a substrate; the first power signal line is formed in the second metal layer, and the second power signal line and the pulse width modulation signal line are formed in the first metal layer and are electrically insulated from each other.

Figure 15:
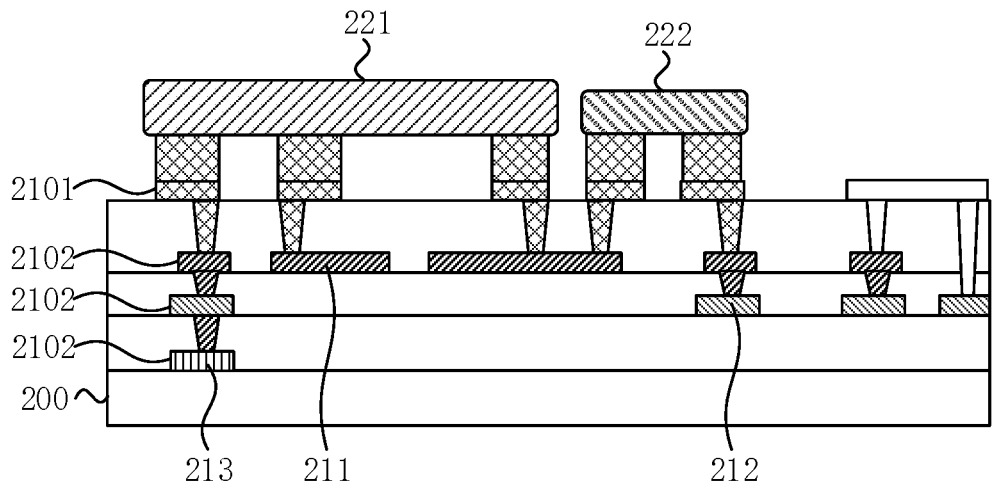
FIG. 15 is the cross-sectional view of another light emitting device according to an embodiment of the present disclosure.

Exemplarily, FIG. 15 is a cross-sectional view of another light emitting device according to an embodiment of the present disclosure. In conjunction with FIG. 10 and FIG. 15, the circuit layer 210 includes three metal layers 2102. Each of the first power signal line 211, the second power signal line 212, and the pulse width modulation signal line 213 is independently formed in a metal layer 2102, and he first power signal line 211, the second power signal line 212, and the pulse width modulation signal line 213 is independently formed in a metal layer 2102 are sequentially close to the substrate 200 according to a distal-to-proximal order. In other embodiments, the first power signal line 211, the second power signal line 212, and the pulse width modulation signal line 213 can also be disposed in the three metal layers 2102 in other manners.

The metal layer 2102 and the binding layer 2101 are separately disposed in the light emitting device shown in FIG. 12 to FIG. 14; in other embodiments, the binding layer 2101 may also reuse the metal layer 2102 away from the substrate 200, which will be described exemplarily in conjunction with FIG. 16.

Figure 16:
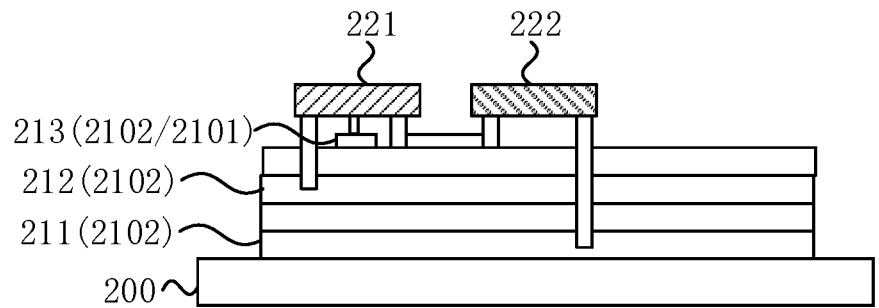
FIG. 16 is the cross-sectional view of another light emitting device according to an embodiment of the present disclosure.

Exemplarily, FIG. 16 is a cross-sectional view of another light emitting device according to an embodiment of the present disclosure. In conjunction with FIG. 10 and FIG. 16, the circuit layer 210 includes three metal layers 2102, where a metal layer 2102 farthest from the substrate 200 is used as the binding layer 2101, and at the same time, the pulse width modulation signal line 213 is formed in the metal layer 2102, and the first power signal line 211 and the second power signal line 212 are independently formed in the other two metal layers 2102, respectively.

Exemplarily, corresponding to the cross-sectional diagram of the light emitting device shown in FIG. 16, S120 in FIG. 1 may include: sequentially forming a first metal layer, a first insulating layer, a second metal layer, a second insulating layer and a third metal layer (that is, binding layer) on one side of a substrate; the first power signal line is formed in the second metal layer, and the second power signal line is formed in the second metal layer and the pulse width modulation signal line is formed in the third metal layer.

It should be noted that, in FIG. 16, a connecting line of the light emitting element 222 and the first power signal line 211 passes through the second power signal line 212, and in an actual product structure, the connecting line and the second power signal line 212 are electrically insulated by a via and an insulating layer covering a sidewall surface of the via.

Figure 17:
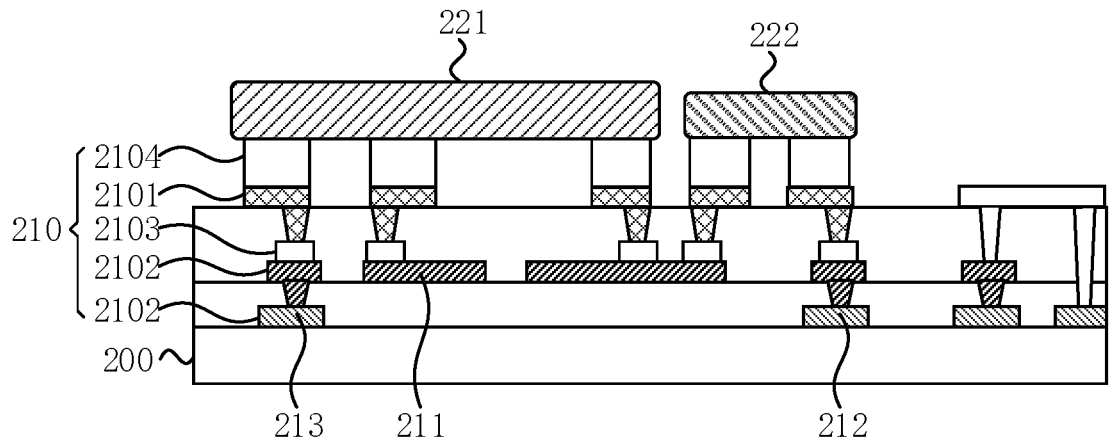
FIG. 17 is the cross-sectional view of another light emitting device according to an embodiment of the present disclosure.

In an embodiment, FIG. 17 is a cross-sectional view of another light emitting device according to an embodiment of the present disclosure. Referring to FIG. 17, the circuit layer 210 further includes a protective layer 2103; the protective layer 2103 is formed between the binding layer 2101 and a metal layer 2102 closest to the binding layer 2101.

The material of the protective layer 2103 is conductive, so that the binding layer 2101 can be electrically connected to the metal layer 2102; meanwhile, the protective layer 2103 slowly reacts with water and oxygen and can protect the metal layer 2102 covered by the protective layer 2103, thereby delaying performance attenuation of the metal layer 2102.

By this way, when the substrate 200 forming the circuit layer 210 is transferred between different chambers, the protective layer 2103 can protect the metal layer 2102 covered by the protective layer 2103, so as to prevent the metal layer 2102 from being directly exposed to the air and being corroded by water and oxygen, thereby delaying performance attenuation of the circuit layer 219, and ensuring good performance and performance stability of the light emitting device.

Exemplarily, a forming process related to the protective layer 2102 may include: forming an insulating layer on a side of the metal layer 2102 far away from the substrate 200; forming a via in the insulating layer, where the via exposes a position where the circuit layer needs to be electrically connected to the light emitting element and the switching element, forming a protective layer in the via, and patterning the protective layer to fill the protective layer in the via; forming a binding layer 2101 electrically connected to the protective layer in the insulating layer on a side away from the substrate 200 and the via of the insulating layer. In an embodiment, the protective layer may be formed by pre-patterning, and then the insulating layer is formed, which is not limited in the embodiment of the present disclosure.

Exemplarily, the material of the protective layer 2103 may be a transparent metal oxide such as indium tin oxide, or another conductor with strong resistance to corrosion by water and oxygen, which is not limited in the embodiment of the present disclosure.

In other embodiments, the metal layer 2102 closest to the binding layer 2101 may be reused as the protective layer 2103, that is, the metal layer 2102 closest to the binding layer 2101 is formed by using a metal having a high resistance to corrosion by water and oxygen, and the metal layer 2102 is used as a protective layer 2103 of another metal layer 2102.

In other embodiments, the binding layer 2101 may also be reused as a protection layer 2103, that is, the binding layer 2101 is formed by using a metal with a strong resistance to corrosion by water and oxygen, and the metal layer 2102 is used as a protective layer 2103 of another metal layer 2102.

In other embodiments, when the circuit layer 210 includes only one metal layer 2102, the metal layer 2102 may be formed by a metal with high resistance to corrosion by water and oxygen, and the metal layer may be used to bind the light emitting device and the switching device; thus, the metal layer 2102 can be used as both the protection layer 2103 and the binding layer 2101.

In an embodiment, with continued reference to FIG. 17, the circuit layer 210 further includes a weld assisting layer 2104; the weld assisting layer 2104 is formed on one side of the binding layer 2101 far away from the substrate 200.

In the conventional process, the weld assisting layer 2104 can be a paste mask, which is a film layer used in the machine mounting, and the main function of the paste mask assists deposition of the solder paste, so that an accurate amount of solder paste can be transferred to an accurate position on an empty PCB.

In the embodiment of the present disclosure, the weld assisting layer 2104 is beneficial to implementing reliable connection of the light-emitting element and the switching element with the binding layer. Exemplarily, the material of the weld assisting layer 2104 may be a metal material such as copper, silver, gold, or other weld assistant materials known to those skilled in the art, which is not limited in the embodiment of the present disclosure.

Exemplarily, in the process, the weld assisting layer 2104 may be formed by evaporation or electroplating, which is not limited in the embodiment of the present disclosure.

Figure 18:
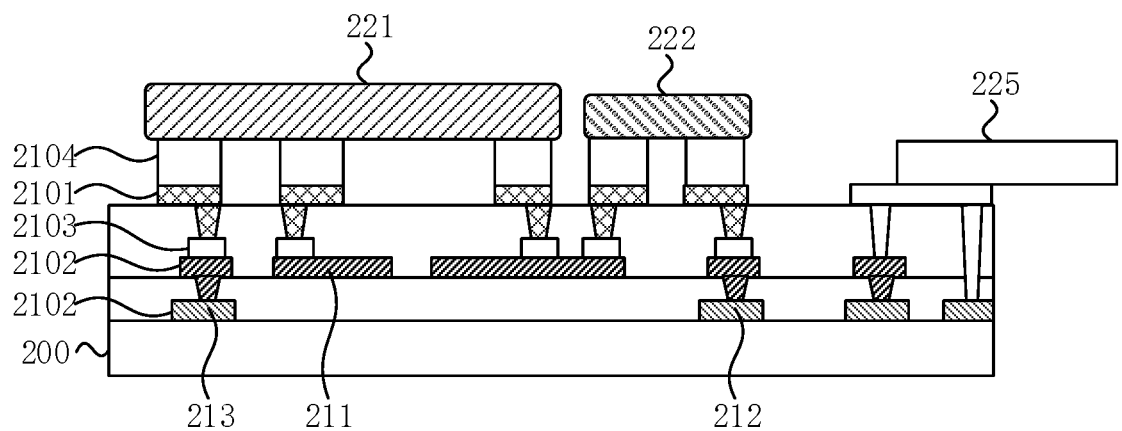
FIG. 18 is the cross-sectional view of another light emitting device according to an embodiment of the present disclosure.

FIG. 18 is a cross-sectional view of another light emitting device according to an embodiment of the present disclosure. On the basis of FIG. 17, referring to FIG. 18, after the switching element 221 and the light emitting element 222 are electrically connected to the circuit layer 210, the IC/PFC 225 may also be electrically connected to the circuit layer 210, so that transmission of signals may be implemented, thereby implementing light emission or display of the light emitting device.

In the above, the light emitting device and the manufacturing method of the light emitting device are described exemplarily by taking only that the switching element and the light emitting element are electrically connected to a same side of the substrate as an example. When the switching element and the light emitting element are disposed on the same side of the substrate, the light emitting element and the switching element can be simultaneously die-bonded, and the process is simple.

Figure 19:
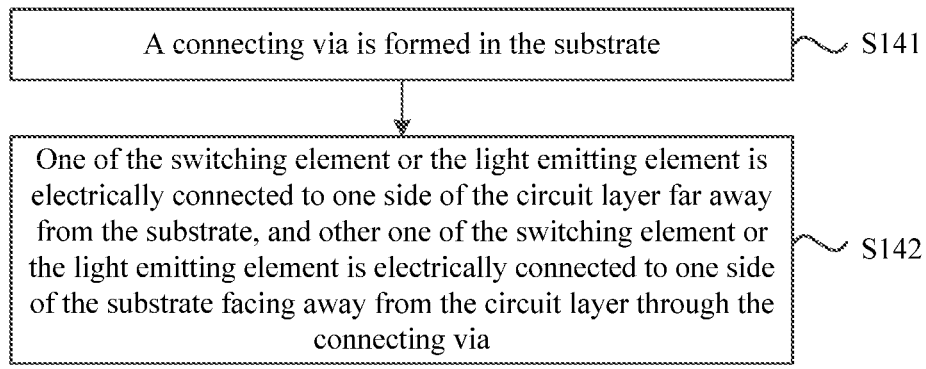
FIG. 19 is the detailed flow of S140 according to the manufacturing method shown in FIG. 3.
Figure 20:
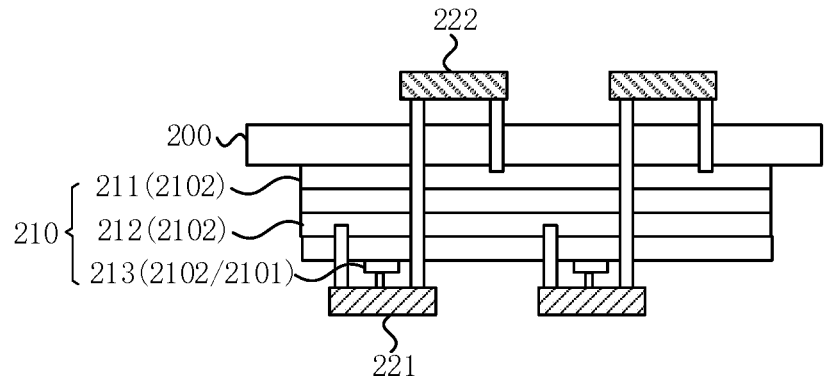
FIG. 20 is the cross-sectional view of another light emitting device according to an embodiment of the present disclosure.
Figure 21:
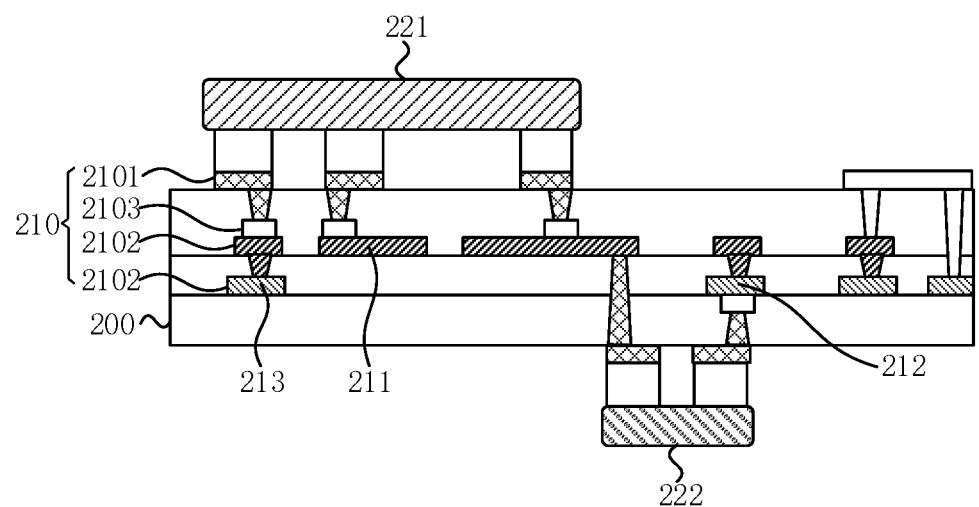
FIG. 21 is the cross-sectional view of another light emitting device according to an embodiment of the present disclosure.

In other embodiments, the switching element and the light emitting element can be electrically connected to different sides of the substrate to improve the light shielding of the light emitting element by the switching element, which is beneficial to the light exiting of the light emitting element, and the following description is made in conjunction with FIG. 19 to FIG. 21.

In an embodiment, FIG. 19 is the detailed flow of S140 according to the manufacturing method shown in FIG. 3. In conjunction with FIG. 3 and FIG. 19, S140 may include steps described below.

In S141, a connecting via is formed in the substrate.

The first power signal line has a first hollow region, the second power signal line has a second hollow region, and a vertical projection of the first hollow region on the substrate and a vertical projection of the second hollow region on the substrate overlap with the connecting via.

In order to realize this structure, before S141, S120 may include steps described below. A first metal layer is formed on one side of the substrate, a via penetrating the first metal layer is formed in the first metal layer, a first insulating layer is formed on one side of the first metal layer far away from the substrate; a second metal layer is formed on the side of the first insulating layer away from the substrate, and a via penetrating the second metal layer is formed in the second metal layer, where the via in the first metal layer and the via in the second metal layer can pass through, the second insulating layer and the third metal layer are sequentially formed on the side of the second metal layer away from the first insulating layer, a via is formed in the first insulating layer and the second insulating layer to prepare for an electrical connection between the switching element and the second power signal line in the second metal layer, an electrical connection between the switching element and the light emitting element, and an electrical connection between the light emitting element and the first power signal line in the first metal layer.

Thereafter, S141 may include steps described below. A first connecting via and a second connecting via, which penetrate the substrate, are formed in the substrate; the first connecting via is used for implementing an electrical connection between the light emitting element and the switching element, and the second connecting via is used for implementing an electrical connection between the light emitting element and the first power signal line.

In other embodiments, when the circuit layer is another layer structure known to those skilled in the art, S120 and S141 can be adjusted according to the requirements of the light emitting device and the manufacturing method thereof, which is not limited in the embodiment of the present disclosure.

It can be understood that, because vias of the metal layer and the insulating layer are formed (that is, patterning) through different processes, which are dry etching and wet etching, respectively. The via in each insulating layer can be formed step by step or can also be formed uniformly in one step, which is not limited in the embodiment of the present disclosure.

In S142, one of the switching element or the light emitting element is electrically connected to one side of the circuit layer far away from the substrate, and the other one of the switching element or the light emitting element is electrically connected to one side of the substrate far away from the circuit layer through the connecting via.

In this way, the light emitting element and the switching element can be disposed on different sides of the substrate. The light emitting element such as the LEDs can emit light from multiple sides. If another circuit element, such as the switching element, exists around the light emitting element, some large-angle light will be blocked by the switching element. In this embodiment, the light emitting element and the switching element are disposed on different sides of the substrate, and the light emitted by the light emitting element will not be blocked by the other circuit element, which is beneficial to emitting light from the light emitting element. The structure of the light emitting device will be exemplarily described below in conjunction with FIG. 20 and FIG. 21.

Exemplarily, FIG. 20 is a cross-sectional view of another light emitting device according to an embodiment of the present disclosure, and FIG. 21 is a cross-sectional view of another light emitting device according to an embodiment of the present disclosure. Referring to FIG. 20 and FIG. 21, in the light emitting device, the switching element 221 is electrically connected to the side of the circuit layer 210 far away from the substrate 200, and the light emitting element 222 is electrically connected to the side of the substrate 200 far away from the circuit layer 210.

In other embodiments, the light emitting element 222 may be electrically connected to the side of the circuit layer 210 far away from the substrate 200, and the switching element 221 is electrically connected to the side of the substrate 200 far away from the circuit layer 210, which is not limited in the embodiment of the present disclosure.

Figure 22:
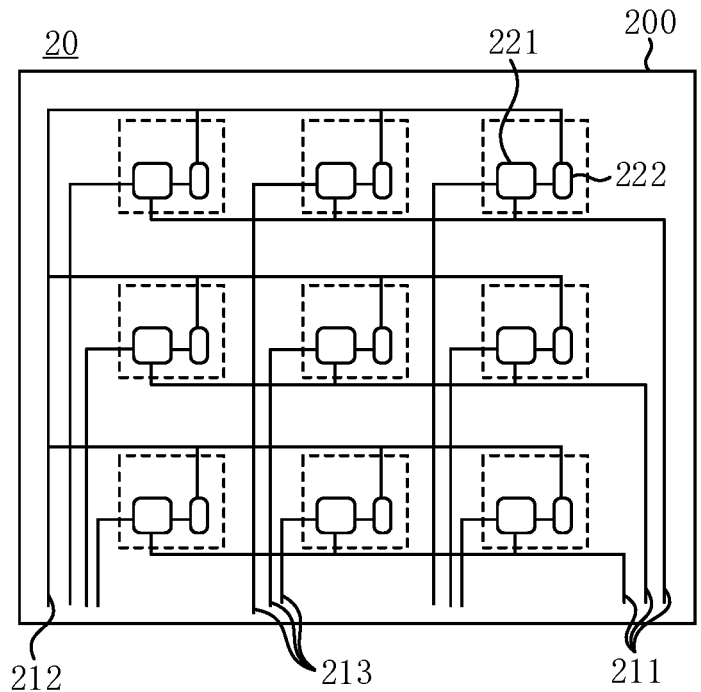
FIG. 22 is a planar block diagram of another light emitting device according to an embodiment of the present disclosure.

Exemplarily, FIG. 22 is a planar block view of another light emitting device according to an embodiment of the present disclosure. Referring to FIG. 22, in the light emitting device, the first power signal line 211, the second power signal line 212, and the pulse width modulation signal line 213 have small line widths, so that more space can be reserved to form the via penetrating the circuit layer.

Figure 23:
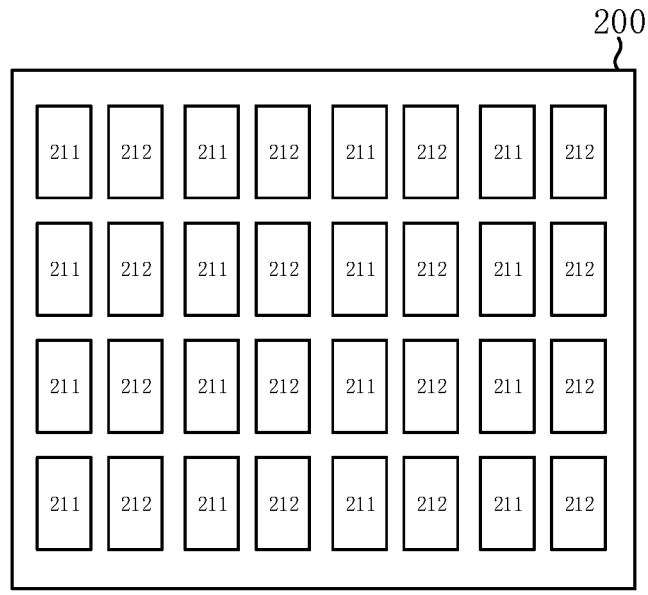
FIG. 23 is a planar block diagram of another light emitting device according to an embodiment of the present disclosure.

Exemplarily, FIG. 23 is a planar block diagram of another light emitting device according to an embodiment of the present disclosure. Referring to FIG. 23, in the light emitting device, the first power signal lines 211 and the second power signal lines 212 are disposed on different zone in a same layer, and each of the first power signal lines 211 and each of the second power signal lines 212 can be connected to an external power by using thin wires extending vertically. Based on this, when the switching element and the light emitting element are electrically connected to opposite sides of the substrate, there is no need to form an additional via on the first power signal line 211 and the second power signal line 212.

In other embodiments, when the first power signal line 211, the second power signal line 212, and the pulse width modulation signal line 213 are disposed in other manners known to those skilled in the art, the via on each signal line can be set according to the requirements of the light emitting device and the manufacturing method thereof, and the light emitting element and the switching element are only required to be connected to different sides of the substrate, which is not limited in the embodiment of the present disclosure.

In an embodiment, on the basis of FIG. 3 and FIG. 19, after S120 and before S140, the method further includes steps described below.

In step one, a connecting layer is formed on one side of the substrate far away from the circuit layer and in the connecting via.

In step two, one of the switching element or the light emitting element is electrically connected to the circuit layer through a connecting line in the connecting layer.

In this way, the light emitting element and the switching element can be connected to the circuit layer on different sides of the substrate.

In an embodiment, the step in which the connection via is formed in the substrate includes a step described below. The connecting via in the substrate is formed by a laser drilling manner.

The laser drilling manner has high energy and accurate positioning; the connecting via can be formed in the substrate efficiently and accurately by using laser drilling.

In other embodiments, other manner known to those skilled in the art can also be used to form the via in the substrate, which is not limited in the embodiment of the present disclosure.

In an embodiment, in order to better control the magnitude of the current passing through the light emitting element, a resistor can also be added to the path between the switching element and the light emitting element to control the current passing through the light emitting element to ensure that the light emitting element will not be damaged due to overload.

In the actual product structure, the resistor can be formed in the circuit layer and the signal line synchronously; or the resistor may be electrically connected to the circuit layer together with the light emitting element and/or the switching element by using the die-bonding manner. Hereinafter, an exemplary description will be given in conjunction with FIG. 24 to FIG. 29.

Figure 24:
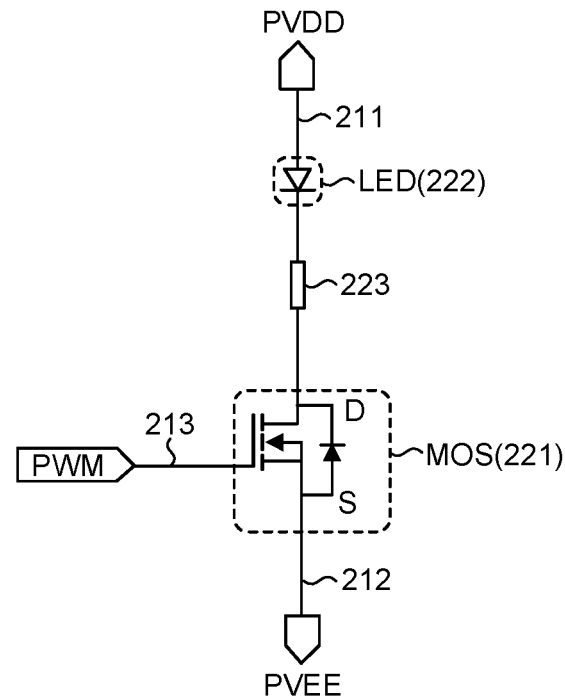
FIG. 24 is another zone circuit according to an embodiment of the present disclosure.
Figure 25:
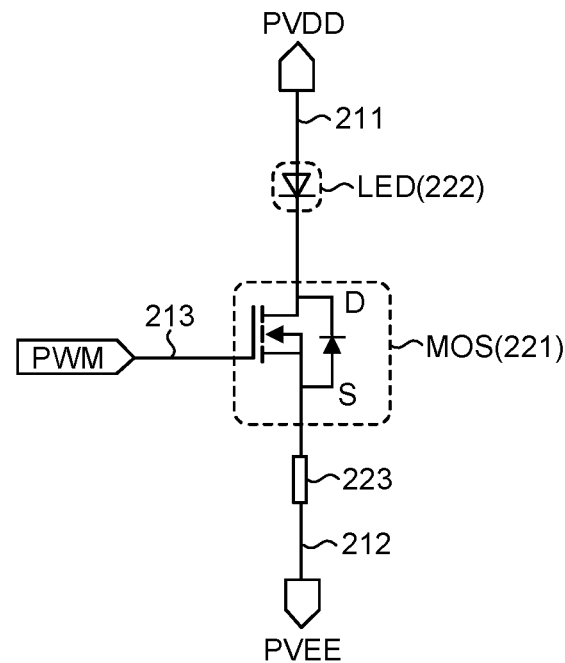
FIG. 25 is yet another zone circuit according to an embodiment of the present disclosure.

Exemplarily, FIG. 24 is another zone circuit according to an embodiment of the present disclosure, and FIG. 25 is yet another zone circuit according to an embodiment of the present disclosure. Referring to FIG. 24 and FIG. 25, the resistor 223 and the light emitting element 222 are electrically connected in series between the first power signal line 211 and the second power signal line 212.

The resistor 223 is used as a current limiting resistor 223.

The current limiting resistor 223 is used for reducing the current on the path to implement current protection. That the resistor 223 is limited current based on Ohm's law can be understood: when the light emitting element 222 is short-circuited, the voltage on the path increases, and the current will soar; in this embodiment, by setting the resistor 223 and using the voltage drop generated on the resistor 223, the current will not soar, thereby implementing the current limiting to protect the light emitting element 222.

Exemplarily, the relationship between the current on the path, that is, the current I flowing through the light emitting element 222, and the resistance R of the current limiting resistor 223 may be:

$$I=(PVDD-PVEE-VLED)/(R+Rmos);$$

In this equation, PVDD represents a first power signal (also called a first potential) transmitted by the first power signal line 211, and PVEE represents a second power signal (also called a second potential) transmitted by the second power signal line 212, VLED represents a threshold voltage of the light emitting element 222, and Rmos represents an on-state resistance value of the switching element 221.

In this way, the resistance value of the resistor 223 can be determined according to the above equation, so as to implement the effective current limiting protection.

In addition, when the switching element 221 uses a p-type MOS transistor, the resistor 223 is disposed on a drain of the MOS transistor, which is more beneficial to ensuring the on-state of the MOS transistor. Specifically, because a voltage drop exists on the resistor 223, when the current is larger, the voltage drop on the resistor 223 will be larger. If the resistor 223 is disposed on the source of the MOS transistor, when the voltage drop increases, the voltage difference between the gate and the source of the MOS transistor will reduce, when the voltage difference is reduced to be less than the threshold voltage of the MOS transistor, the MOS transistor will be turned off; and if the resistor 223 is disposed on the drain of the MOS transistor.

On this basis, the MOS transistor can be PMOS or NMOS. The resistance value of the current limiting resistor 223 is determined according to the difference in voltage drop between the proximal end and the distal end and the power consumption requirements. Generally, the resistance value of the current limiting resistor 223 is equal to or less than 1000 ohms. This will be described in detail below in conjunction with FIG. 36 and FIG. 37.

Figure 26:
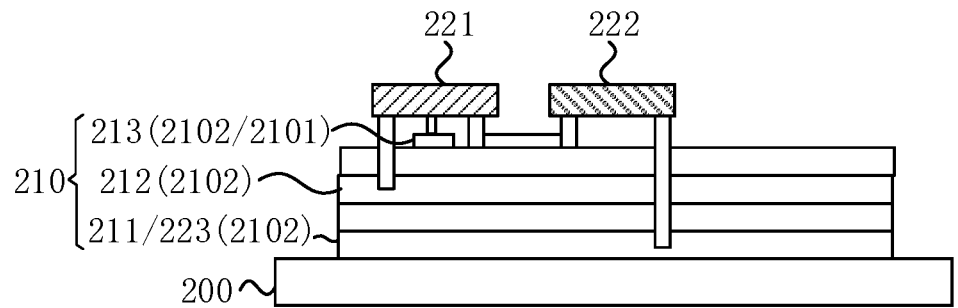
FIG. 26 is the cross-sectional view of another light emitting device according to an embodiment of the present disclosure.

Exemplarily, FIG. 26 is a cross-sectional view of another light emitting device according to an embodiment of the present disclosure, and a structure of the light emitting device in which the resistor is formed in the circuit layer is shown in FIG. 26. Referring to FIG. 26, the circuit layer 210 further includes the resistor 223; the resistor 223 and at least one of the first power signal line 211, the second power signal line 212, or the pulse width modulation signal line 213 use a same material and are formed in a same process.

By this way, the light emitting device can have less film layers and can be thinner; at the same time, no additional process steps are added, the process steps can be reduced, and the overall manufacturing method can be simpler.

Exemplarily, FIG. 26 shows that the resistor 223 and the first power signal line 211 are formed in a same layer. In other embodiments, the resistor 223 may also be formed in other conductive layers (including the metal layer, the binding layer, and the protective layer) in the circuit layer 210, which is not limited in the embodiment of the present disclosure.

Figure 27:
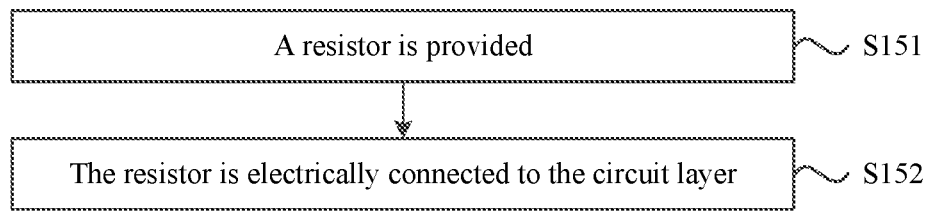
FIG. 27 is the flowchart illustrating a manufacturing method for another light emitting device according to an embodiment of the present disclosure.

In an embodiment, FIG. 27 is a flowchart illustrating a manufacturing method for another light emitting device according to an embodiment of the present disclosure. On the basis of FIG. 3, referring to FIG. 27, the manufacturing method further includes steps described below.

In S151, a resistor is provided.

Exemplarily, the resistor may be a resistor with variable resistance or a resistor with fixed resistance, which is not limited in the embodiment of the present disclosure.

In S152, the resistor is electrically connected to the circuit layer.

Exemplarily, this step may include: die-bonding and electrically connecting the resistor to the binding layer in the circuit layer.

In related art, the quality inspection after die-bonding is generally performed by human-eye observation. A case where the light emitting element is damaged (for example, the light emitting element is short-circuited and out of work) and cannot be observed by the human eyes may exist. At this time, the light emitting element with the risk of short-circuiting is die-bonded on the circuit layer, and the light emitting element exhibits a certain resistance characteristic in the path, which can be a resistor voltage-divider. If the light-emitting element is short-circuited, the voltage divider effect no longer exists, which causes an increase in the current, thereby increasing the heating power and causing overheating. In this embodiment, by die-bonding a current limiting resistor, the current limiting resistor can be used for limiting the magnitude of the current increase, so as to alleviate and even avoid overheating caused by the short-circuiting of the light emitting element.

The resistor and the light emitting element are electrically connected in series between the first power signal line and the second power signal line, as shown in FIG. 24 or FIG. 25.

Figure 28:
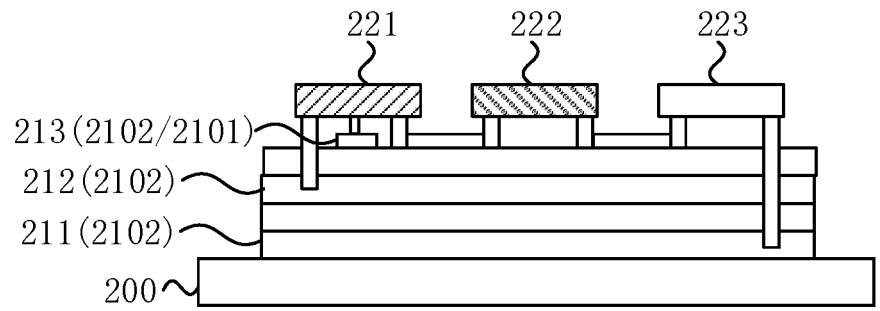
FIG. 28 is the cross-sectional view of another light emitting device according to an embodiment of the present disclosure.

Exemplarily, FIG. 28 is a cross-sectional view of another light emitting device according to an embodiment of the present disclosure. Referring to FIG. 28, the resistor 223 may be electrically connected between the light emitting element 222 and the first power signal line 211.

Figure 29:
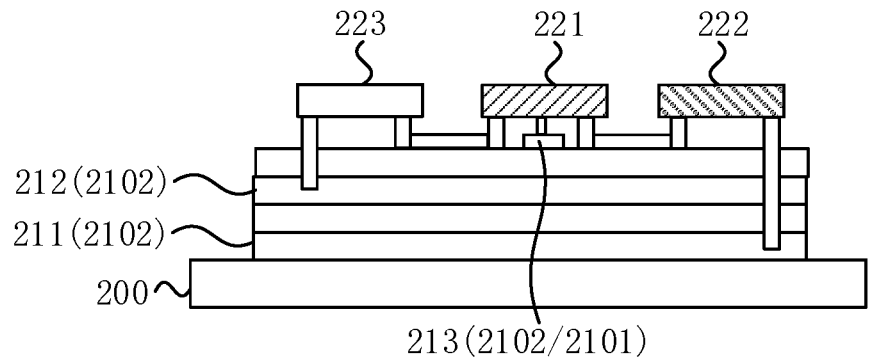
FIG. 29 is the cross-sectional view of another light emitting device according to an embodiment of the present disclosure.

Exemplarily, FIG. 29 is a cross-sectional view of another light emitting device according to an embodiment of the present disclosure. Referring to FIG. 29, the resistor 223 may be electrically connected between the second power signal line 212 and a first terminal of the control element 221.

In other embodiments, the resistor 223 can also be electrically connected in series to the light emitting element 222 between the first power signal line 211 and the second power signal line 212 in other manners known to those skilled in the art, which is not limited in the embodiment of the present disclosure.

In conjunction with FIG. 30 to FIG. 34, taking that the first power signal line and the second power signal line are disposed on a same layer as an example, the forming process of the circuit layer will be described exemplarily.

Exemplarily, Each of FIG. 30 to FIG. 34 is a schematic diagram of a film layer stack in which a circuit layer corresponds to a single zone in a manufacturing method of a light emitting device according to an embodiment of the present disclosure. In the film layer stack structure, the first power signal line 211, the second power signal line 212, and the pulse width modulation signal line 213 are formed in the same layer, and the zone is connected to one switching element, four light emitting elements, and one resistor.

Figure 30:
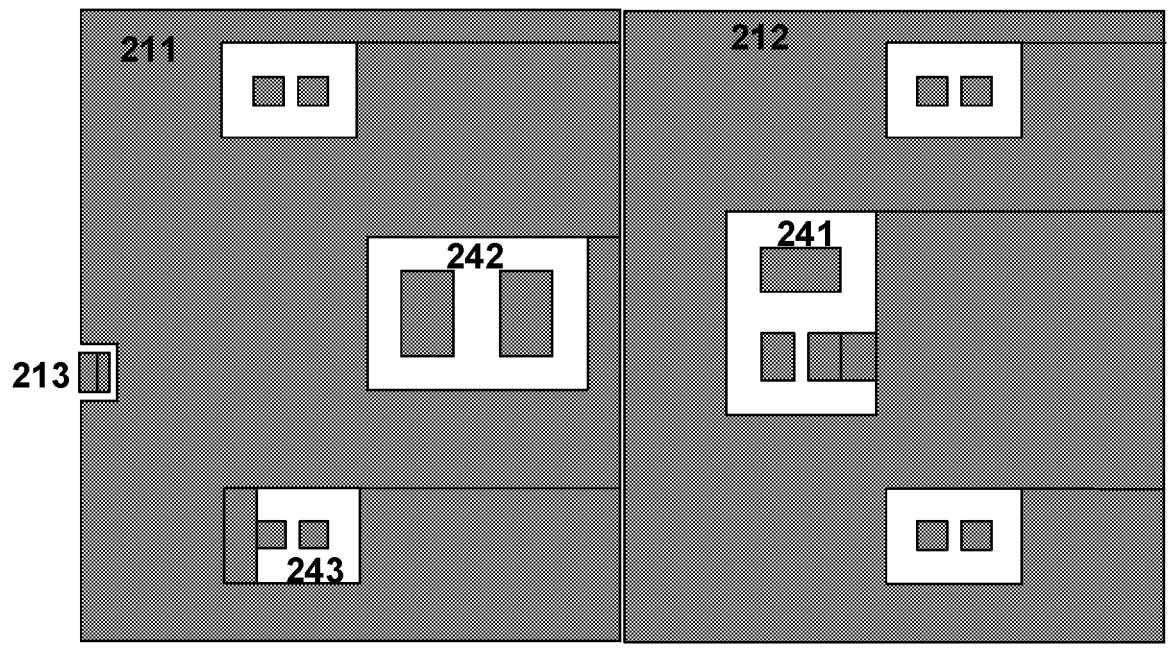

Exemplarily, FIG. 30 shows a layout of the first metal layer, which includes a first power signal line 211, a second power signal line 212, a pulse width control signal line 213 and a first pad group 241 reserved for connecting switching elements, a second pad group 242 reserved for connecting light emitting elements, and a third pad group 243 reserved for connecting resistors; the first pad group 241 is used for electrically connecting pads of the first terminal of the switching element to the second power signal line 212, and one of the pads in the third pad group 243 is electrically connected to the first power signal line 211.

Figure 31:
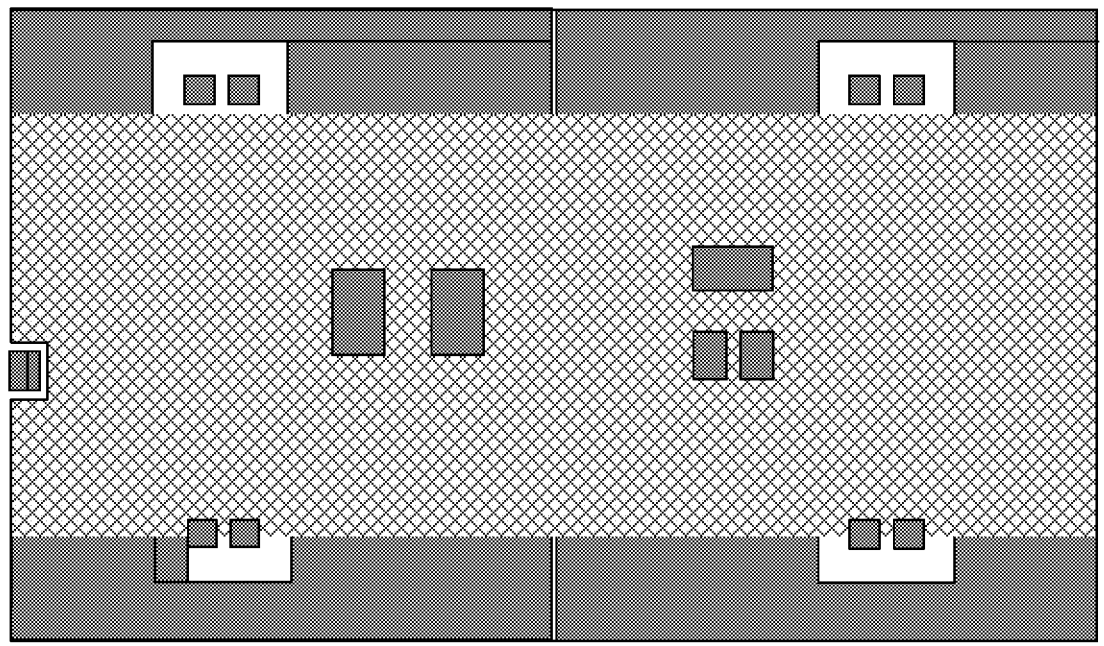

Exemplarily, FIG. 31 shows a layout diagram of a film layer stack after covering a first insulating layer on a first metal layer. The first insulating layer includes a plurality of vias, and the vias expose the three pad groups in FIG. 30.

Figure 32:
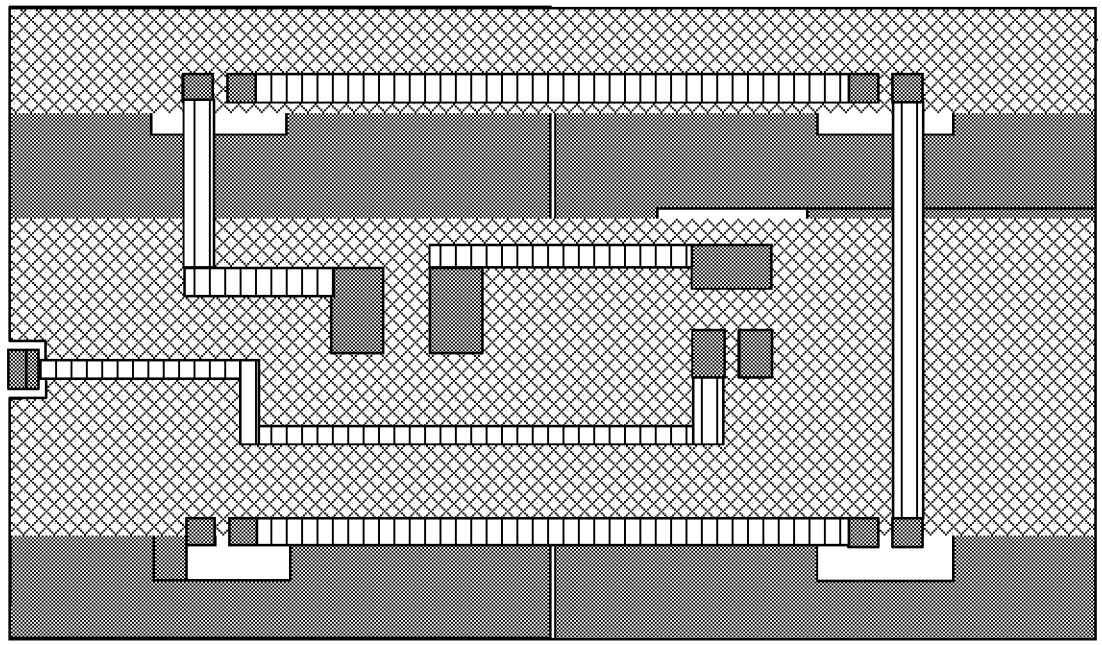

Exemplarily, FIG. 32 shows a layout diagram of a film layer stack after a second metal layer is formed on the first insulating layer, and a plurality of metal wires are formed in the second metal layer. In conjunction with FIG. 20, the plurality of metal wires are respectively used for electrically connecting the pulse width modulation signal line 213 to the pads of the first pad group 241 for electrically connecting the control terminal of the switching element, used for connecting the pad in the first pad group 241 used for electrically connecting the second terminal of the switching element is electrically connected to one pad in the second pad group 242, used for electrically connecting the other pads in the second pad group 242 respectively in pairs, and used for electrically connecting the remaining unconnected pads in the second pad group 242 to the remaining unconnected pads in the third pad group 243.

Figure 33:
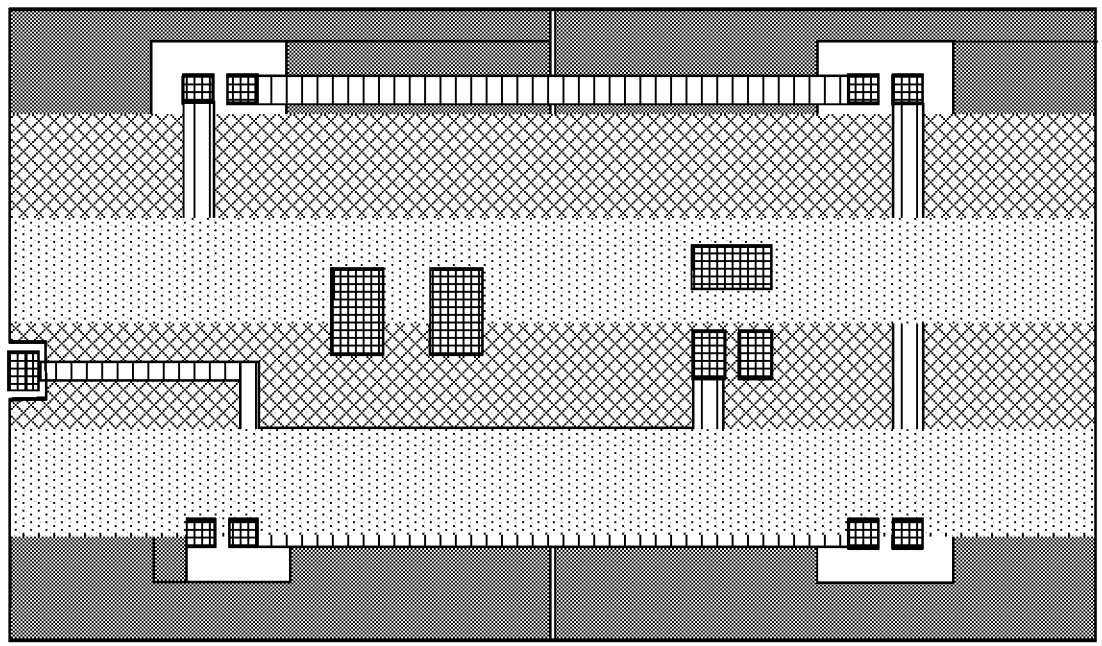

Exemplarily, FIG. 33 shows a layout diagram of a film layer stack after a protective layer and a second insulating layer are formed on the second metal layer. The second insulating layer includes a plurality of vias, and the vias expose the three pad groups in FIG. 30 and FIG. 32. The protective layer is used for covering the above three pad groups.

Figure 34:
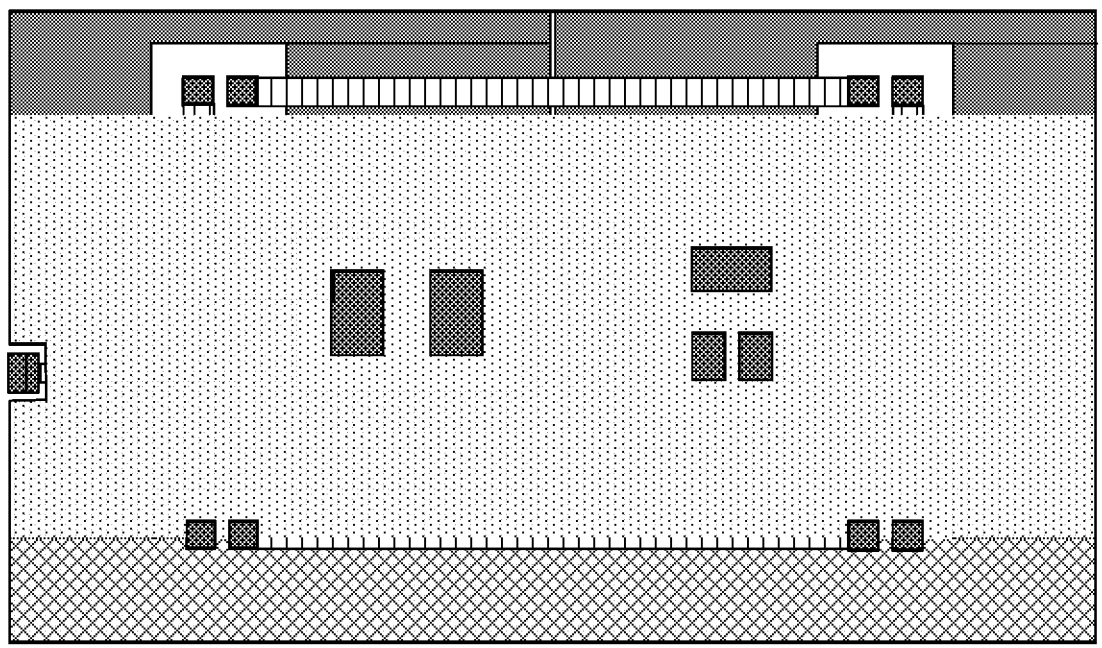

Exemplarily, FIG. 34 shows a layout diagram of a film layer stack after forming a binding layer on the protective layer. The binding layer includes a plurality of binding blocks, which respectively cover to a plurality of discrete protective blocks in the protective layer in one-to-one correspondence, so as to implement electrical connection.

Thereafter, the switching element is correspondingly bound on the position of the first pad group 241, the light emitting element is correspondingly bound on the position of the second pad group 242, and the resistor is correspondingly bound on the position of the third pad group 243.

Thus, a light emitting device is formed.

On the basis of the above-mentioned embodiments, the embodiment of the present disclosure also provide a light emitting device, which can be manufactured using any one manufacturing method of the light emitting device provided in the above-mentioned embodiments. Therefore, the light emitting device also has the technical effects of the manufacturing method of the light emitting device in the above-mentioned embodiments, and the similarities can be understood with reference to the above explanation of the manufacturing method of the light emitting device, and will not be repeated hereafter.

Exemplarily, continuing to refer to FIG. 6 and FIG. 7, the light emitting device 20 includes a substrate 200, a circuit layer 210, and at least one switching element 221 and at least one light emitting element 222. The circuit layer is formed on one side of the substrate 200, where the circuit layer 210 includes a first power signal line 211, a second power signal line 212 and a pulse width modulation signal line 213. The switching element 221 and the light emitting element 222 are electrically connected to the circuit layer 210. The switching element 221 includes a control terminal 2211, a first terminal 2212 and a second terminal 2213; the control terminal 2211 is electrically connected to the pulse width modulation signal line 213, the first terminal 2212 is electrically connected to the first power signal line 211, and the second terminal 2213 is electrically connected to the second power signal line 212; the light emitting element 222 is electrically connected between the first terminal 2212 and the first power signal line 211, or the light emitting element 222 is electrically connected between the second terminal 2213 and the second power signal line 212.

By this way, the circuit layer 210 only includes the signal line and does not form the switching element; the switching element and light emitting element are additionally provided and electrically connected to the circuit layer. Therefore, the process flow is simpler and the cost is lower.

Meanwhile, the adjustment of different display greyscales can be implemented by adjusting different pulse widths (that is, duty cycles) of the PWM. In this way, the greyscale control is less difficult, the adjustment manner is simple, and the power consumption is low; at the same time, multiple divisions can be implemented, and the cost is low.

In an embodiment, FIG. 35 shows another zone circuit according to the embodiment of the present disclosure. Referring to FIG. 35, or continuing to refer to any one of FIG. 8 to FIG. 9 and FIG. 24 to FIG. 25, one of the first power signal line 211 or the second power signal line 212 is used for transmitting a first potential PVDD, and other one of the first power signal line 211 or the second power signal line 212 is used for transmitting a second potential PVEE; and the first potential PVDD is equal to or greater than a threshold voltage of the light emitting element 222, and the second potential PVEE is equal to a zero potential.

By this way, a potential difference of two ends of the light emitting element 222 electrically connected between the first power signal line 211 and the second power signal line 212 is greater than the threshold voltage, so that the light emitting element 222 can be driven to emit light normally.

At the same time, the second potential PVEE is set to a zero potential, so that the calculation method of the current flowing through the light emitting element 222 can be simpler, and the control of the current can be easily implemented, so that the control of the greyscale can be easily implemented.

It can be understood that the level of the potential signal transmitted by the first power signal line 211 and the second power signal line 212 can be set according to the placement direction of the light emitting element 222. The anode receives the high potential and the cathode receives the low potential to ensure that the light emitting element 222 can be turned on, so that the light emitting element 222 can be driven to emit light.

In an embodiment, continuing to refer to FIG. 10, the circuit layer 210 includes a binding layer 2101 far away from the substrate 200, and the switching element 221 and the light emitting element 222 are electrically connected to the binding layer 2101.

By this way, the binding layer 2101 can be used for implementing the signal line in the circuit layer 210 reliably connecting to the switching element 221 and the light emitting element 222, thereby ensuring that the light emitting device has a relatively stable structure and prolonging the service life of the light emitting device.

In an embodiment, continuing to refer to any one of FIG. 12 to FIG. 16, the circuit layer 210 further includes at least one metal layer 2102, and the metal layer 2102 is disposed between the substrate 200 and the binding layer 2101; each of the first power signal line 211, the second power signal line 212, and the pulse width modulation signal line 213 is disposed in any one of the metal layer 2102.

The resistance value of the metal layer 2102 is relatively small. By forming a signal line in any one metal layer 2102, it is beneficial to reducing the potential signal difference between the proximal end and the distal end of the signal line, thereby improving the light emitting uniformity.

At the same time, a number of layers of the metal layer 2102 can be flexibly set according to the requirements of the light emitting device, and the distribution of each signal line in the metal layer can be flexibly set according to the requirements of the light emitting device.

In an embodiment, referring to FIG. 17 or FIG. 18, the circuit layer 210 further includes a protective layer 2103; the protective layer 2103 is disposed between the binding layer 2101 and a metal layer 2102 closest to the binding layer 2101.

The material of the protective layer 2103 is conductive, so that the binding layer 2101 can be electrically connected to the metal layer 2102; meanwhile, the protective layer 2103 is slowly reacted with water and oxygen and can protect the metal layer 2102 covered by the protective layer 2103, thereby delaying performance attenuation of the metal layer 2102.

In other embodiments, the protective layer 2103 may reuse the metal layer 2102 closest to the binding layer 2101; or the protective layer 2103 may reuse the binding layer 2101.

By this setting, the film structure of the circuit layer 210 can be simpler and the number of film layers is small, so that the thickness of the circuit layer 210 and the light emitting device as a whole is thinner, which is beneficial to implementing the thin design of the light emitting device.

In an embodiment, continuing to refer to FIG. 20 or FIG. 21, the substrate 200 includes a connecting via; and one of the switching element 221 or the light emitting element 222 is disposed on one side of the circuit layer 210 away from the substrate 200, and other one of the switching element 221 or the light emitting element 222 is disposed one side of the substrate 200 away from the circuit layer 210 and is electrically connected to the circuit layer 210 through the connecting via.

By this way, the switching elements 221 each are disposed on a same side of the substrate 200, and the light emitting elements 222 each are disposed on the other side different from the side where the switching element 221 is disposed, so as to avoid that the large-angle light exited from the light emitting element 222 is blocked by the switching element 22, thereby improving the light exiting of the light emitting element 222.

In an embodiment, continuing to refer to FIG. 24 or FIG. 25, the light emitting device may further include a resistor 223, and the resistor 223 and the light emitting element 222 are electrically connected in series between the first power signal line 211 and the second power signal line 212.

The resistor connected in series with the light emitting element 222 has a current limiting function, so that the light emitting element 222 can be protected by current limiting.

In the actual product structure, the resistor 223 is formed in the circuit layer 210, as shown in FIG. 26. The resistor 223 and at least one of the first power signal line 211, the second power signal line 212, or the pulse width modulation signal line 213 use a same material and are formed in a same process. By this way, the light emitting device can have less film layers and can be thinner; at the same time, no additional process steps are added, the process steps can be reduced, and the overall manufacturing method can be simpler.

In an embodiment, the resistor 223 can be additionally provided, and the resistor 223 can be electrically connected to the circuit layer 210 by using a die-bonding manner, as shown in FIG. 28 or FIG. 29.

By this way, the wiring of the circuit layer 210 can be made simpler. At the same time, the resistance value of the resistor 223 is optional and adjustable, thereby implementing the flexible control of the resistance in the light emitting device.

In an embodiment, FIG. 36 is a planar block diagram of another light emitting device according to an embodiment of the present disclosure.

Referring to FIG. 36, the light emitting device 20 further includes a drive circuit 250. The drive circuit 250 is disposed on an edge of one side of the light emitting device; the first power signal line 211, the second power signal line 212, and the pulse width modulation signal line 213 are electrically connected to the drive circuit 250; the resistor 223 includes a first resistor and a second resistor, the first resistor is disposed on one side of the second resistor close to the drive circuit 250, a resistance value of the first resistor is R, a resistance value of the second resistor is R0, a voltage drop on the first power signal line 211 between the first resistor and the second resistor is ΔV, a potential received by the second resistor is V, and a difference value between a current flowing through the first resistor and a current flowing through the second resistor is C, then: R≥, where C is a constant.

The voltage drop between the distant end and the proximal end on the second power signal line 212 is negligible. Taking the orientation shown in FIG. 36 as an example, since the first power signal (that is PVDD) is provided by a bottom drive circuit 250 and is transmitted along the first power signal line 211 extending longitudinally, the farther away from the drive circuit 250, the larger the impedance on the first power signal line 211, the lower the first power signal, that is, the decrease of PVDD, that is, an IR drop exists, which causes, in the light emitting surface of the light emitting device, the light emitting brightness of the light emitting element 222 in the region close to the drive circuit 250 and the region far away from the drive circuit 250 is different, that is, the brightness uniformity of the light emitting device is poor.

By setting the current limiting resistor 223 in the embodiment of the present disclosure, on the one hand, it can effectively prevent the light emitting element 222 from being damaged due to excessive current; on the other hand, for the IR drop, the resistor 223 at the distant end (that is, far from the drive circuit 250) and the proximal end (that is, close to the drive circuit 250) are designed differently. Specifically, the resistance of the proximal end current limiting resistor is set to be smaller than the resistance of the distant end current limiting resistor, and the voltage drops of the resistor in different regions can be used to superimpose the impedance voltage drop on the first power signal line to compensate for the resistance difference of the first power signal line 211 from proximal end to distant end, so that the current flowing through the light emitting element 222 can be kept consistent in different regions, so that the overall brightness uniformity of the light emitting device is better.

Exemplarily, the distal-end voltage is V, the IR Drop is ΔV, the distal-end current-limiting resistance is R0, and the proximal-end current-limiting resistance is R. When a current at the distal end and a current at the proximal end are required to be equal, R=(1+)R0.

When the product actually works, the current may be identical at the distal end and the proximal end within an error range; for example, if the different between the current at the distal end and the current at the proximal end is within a range of −5 mA to 5 mA, then $$\frac{V+?V}{R} \leq \frac{V}{R0} \pm 0.005;$$

it is thus deduced that $$R \geqslant \frac{(V+\Delta V)R0}{V \pm 0.005 \times R0}.$$

Therefore, in addition to good brightness uniformity, invalid power consumption caused by the current limiting resistor can be reduced, which is beneficial to the consumption of the power source.

Exemplarily, the current limiting resistor may be realized by separate elements with different resistance values, i.e., resistors with different resistance values disposed at different positions in the circuit layer; or the current limiting resistor may be realized by panel design, i.e., film design of the circuit layer.

Exemplarily, the method for designing a panel may include at least one of the following manners.

In manner one, signal lines of different lengths are set. The implementation manner can include designing the signal line as a straight line, a broken line, a curve or a serpentine winding, or the like, so as to design the resistors with different resistance values; exemplarily, with a same line width and a same signal material, the resistance of a serpentine winding resistor is greater than the resistance of the straight line resistor.

In manner two, conductor layers of different materials are set. The implementation manner can include the designing film layers of different materials such as metal layers, metal oxide layers, polysilicon layers, and the like, to as to implement a differentiated design of the resistance of the resistor; Exemplarily, with a same line width and a same line length, the resistance value of the metal layer is the smallest, the resistance value of the metal oxide layer is second smallest, and the resistance value of the polysilicon layer is the largest.

In manner three, wires of different thicknesses are set. The implementation manner can include setting different layers of metal such as single-layer metal, double-layer metal, and multi-layer metal to implement a differentiated design of the resistance of the resistor; exemplarily, the resistance value of the single-layer metal is greater than the resistance value of multi-layer metal.

In other embodiments, other methods known to those skilled in the art can also be used to implement a differentiated design of the resistance of the resistor, which is not described or limited in the embodiments of the present disclosure.

In an embodiment, FIG. 37 is a planar block diagram of another light emitting device according to an embodiment of the present disclosure. On the basis of FIG. 36, referring to FIG. 37, each light emitting element 222 electrically connected to each switching element 221 is connected in series with at least one resistor 223.

By this way, the arrangement of the switching element 211, the light-emitting element 212, and the resistor 213 in each zone can be the same, thereby reducing the difficulty of designing and manufacturing the light emitting device.

In an embodiment, the substrate 200 includes a glass substrate, a printed circuit board substrate, or a flexible circuit board substrate.

In this way, the type of the substrate 200 can be flexibly set according to the requirements of the light emitting device.

When the glass substrate is selected as the substrate 200, the thickness of the glass substrate can be 0.5 mm-1 mm, which is beneficial to implementing a light-weight and thin design of the light emitting device. At the same time, the thermal expansion coefficient of the glass substrate is relatively small, and the positioning is accurate in the binding step, which is beneficial to binding small-sized light emitting elements and switching elements, thereby improving the arrangement density of light emitting element.

The conductor layer where the signal lines on the printed circuit board substrate and the flexible circuit board substrate are located can have a small thickness, so that the impedance of the signal line is relatively small, which is beneficial to implementing the brightness uniformity of the light emitting device.

In other embodiments, the substrate 200 may also be other types of substrates known to those skilled in the art, which is not limited in the embodiment of the present disclosure.

In an embodiment, FIG. 38 is a planar block diagram of another light emitting device according to an embodiment of the present disclosure. Referring to FIG. 38, the first power signal line 221 is wired in a grid, and/or the second power signal line 212 is wired in a grid (not shown in FIG. 38); a vertical projection of the grid on the substrate 200 surrounds the switching element 221 and the light emitting element 222 electrically connected to the switching element 221.

By this way, the resistance of the signal line can be reduced, which is beneficial to reducing IR drop, so that the brightness uniformity of the light emitting device is better; at the same time, the peripheral signal line layout of the light emitting element 222 and the switching element 221 are the same, and each signal line has the same influence on the light emitting element 222 and the switching element 221, which is beneficial to making the light emitting performance of the switching elements 221 the same, so that the brightness uniformity of the light emitting device is better.

It should be noted that, in FIG. 38, only the first power signal line 211 is taken as an example to showing the grid wiring; the second power signal line can be set in this way, and is connected to each switching element 221 or each light emitting element 222 respectively, which is also beneficial to improving the brightness uniformity of the light emitting device, the description will not be repeated in the embodiment of the present disclosure.

In addition, the first power signal line 211 and the second power signal line 212 are wired with the maximum line width limited by space to minimize resistance, as shown in FIG. 30 to FIG. 34. Specifically, the spatial distance from the wires of the first power signal line 211 and the second power signal line 212 to the edge of the light emitting element or the switching element may be equal to or greater than 3 um. In a zone, any position other than the switching element, light emitting element, and pulse width modulation signal line can be used to lay out the first power signal line 211 and the second power signal line 212.

It can be understood that: when the first power signal line 211 and the second power signal line 212 are disposed in a same metal layer, the above-mentioned grid wiring can be implemented by electrically connecting the same type of signal line to cross layers, and the same metal layer can be used for crossing layers or different metal layers are used for crossing layers, which is not limited in the embodiment of the present disclosure.

In an embodiment, FIG. 39 is a planar block diagram of another light emitting device according to an embodiment of the present disclosure. On the basis of FIG. 38, referring to FIG. 39, the substrate 200 includes a light emitting region 201 and a non-light emitting region 202 surrounding the light emitting region 201; the light emitting element 222 and the switching element 221 are disposed in the light emitting region 201; the first power signal line 211, the second power signal line 212 and the pulse width modulation signal line 213 each extend into the non-light emitting region 202 from the light emitting region 201; the light emitting device 20 further includes at least two first connecting terminals 23 lwhich are disposed in the non-light emitting region 202 and located on different sides of the light emitting region 201; first power signal lines 211 extending to a same side is electrically connected to a same first connecting terminal 231, and the two first connecting terminals 231 are electrically connected end to end in sequence; the light emitting device further includes at least two second connecting terminals (not shown in FIG. 39) which are disposed in the non-light emitting region 202 and located on different sides of the light emitting region 201; and second power signal lines 212 extending to a same side is electrically connected to a same second connecting terminal, and the at least two second connecting terminals are electrically connected end to end in sequence.

By this way, at least two first connecting terminals 231 can be used for simultaneously providing a first power signal to the first power signal line 211, and/or at least two second connecting terminals can be used for simultaneously providing a second power signal to the second power signal line 211. Thus, the signal difference on the signal lines at different positions is smaller, that is, at least two first connecting terminals and/or second connecting terminals are used for providing signals, which can reduce signal delay and reduce the charging difference of the distant end and the proximal end, thereby providing the brightness uniformity of the light emitting device.

It should be noted that in FIG. 39, only the first power signal line 211 and the first connection terminal 231 are taken as an example to show the structure of grid wiring and multi-terminal extraction signal; the second power signal line and the second connecting terminal can be set according to this way, which is also beneficial to improving the brightness uniformity of the light emitting device, the description will not be repeated in the embodiment of the present disclosure.

In an embodiment, the first power signal line 211, the second power signal line 212, and the pulse width modulation signal line 213 each have a same extension direction.

With this arrangement, the three lines can be wired in parallel, which is beneficial to reducing the parasitic capacitance existing when signal lines overlap with each other, thereby implementing the accurate control of the light emitting device.

On the basis of the above embodiments, an embodiment of the present disclosure further provides a backlight module including any one light emitting device provided by the above embodiment of the present disclosure. Therefore, the backlight module also has the technical effects of the manufacturing method of the light emitting device in the above-mentioned embodiments, and the similarities can be understood with reference to the above explanation of the manufacturing method of the light emitting device, and will not be repeated hereafter.

Exemplarily, the light emitting device can be used as the light source of the backlight module to implement the brightness zone control of the backlight module, so that when the backlight module is applied to the display device, it can provide backlight for the display panel zone. The high image brightness contrast is beneficial to improving the image display quality and implement the display a high-dynamic range (HDR) image.

On the basis of the above-mentioned embodiments, the embodiment of the present disclosure also provides a display device, which includes the backlight module provided in the above-mentioned embodiment. Therefore, the display device can apply the backlight module in the above-mentioned embodiment to implement the HDR display, therefore improving the image display quality.

Exemplarily, FIG. 40 is a display device of passive light emitting according to an embodiment of the present disclosure. Referring to FIG. 40, the display device includes not only the backlight module (shown as the light emitting device 20), but also a display panel 420. The display panel 420 is disposed on a light emitting side of the backlight module.

The display panel 420 can modulate the light emitted by the light emitting device 20 to display the image to be displayed.

Exemplarily, the display panel 420 may be a liquid crystal display panel or other display panels known to those skilled in the art, which is not limited in the embodiments of the present disclosure.

In the above embodiment, the light emitting device 20 can be used as a backlight source of a display panel 420 emitting light passively. In other embodiments, the above-mentioned light emitting device 20 can also be directly used for display, which will be exemplarily described below in conjunction with FIG. 41 and FIG. 42.

Exemplarily, FIG. 41 is a display panel of active light emitting according to an embodiment of the present disclosure, and the display panel emits light actively. Referring to FIG. 41, the display panel 30 includes any one light emitting device 20 provided by the above embodiments and further includes an opposing substrate 310. The opposing substrate 310 is disposed opposite to the light emitting device 20.

the opposing substrate 310 may be a package structure 310, which may be used for blocking water and oxygen, so as to slow down the performance attenuation of the film layer, increase the stability of the display panel 30, and prolong its service life. Exemplarily, the package structure 310 may be a package substrate or a thin film package layer.

In other embodiments, the display panel may further include other functional components or structural components known by those skilled in the art, which is neither described nor limited in the embodiments of the present disclosure.

On the basis of the above-mentioned embodiments, embodiments of the present disclosure further provide a display device. The display device includes any one of the display panels provided in the above-mentioned embodiments. Therefore, the display device also has beneficial effects of the display panel provided in the above-mentioned embodiments; similarities may be understood with reference to the above description and will not be described hereinafter.

Exemplarily, FIG. 42 is a display device of active light emitting according to an embodiment of the present disclosure, and the display panel emits light actively. Referring to FIG. 42, the display device 40 may further include a protective cover 410 disposed on the light emitting side of the display panel 30.

Exemplarily, the protective cover 410 can be used for preventing impact damage, enhancing the stability of the display device 40, and prolonging its service life.

Exemplarily, the display device 40 may be a mobile phone. In other embodiments, the display device may also be a computer, a smart wearable device (such as a smart watch), a vehicle-mounted display screen, a vehicle-mounted touch screen, or other types of electronic devices known to those skilled in the art, or a device or a component having a display function, which is neither described nor limited in the embodiments of the present disclosure.

In other embodiments, the display panel may further include a flexible printed circuit board, a system chip, and other functional components or structural components known by those skilled in the art, which is neither described nor limited in the embodiments of the present disclosure.

It is to be noted that the above are only some embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A manufacturing method of a light emitting device for display, comprising:
    providing a substrate;
    forming a circuit layer on a side of the substrate;
    providing at least one switching element and at least one light emitting element; and
    electrically connecting the switching element and the light emitting element to the circuit layer;
    wherein the circuit layer comprises a first power signal line, a second power signal line, and a pulse width modulation signal line;
    wherein the switching element comprises a control terminal, a first terminal and a second terminal;
    wherein the control terminal is electrically connected to the pulse width modulation signal line,
    wherein the first terminal is electrically connected to the first power signal line, and the second terminal is electrically connected to the second power signal line;
    wherein (i) the light emitting element is electrically connected to the first terminal and the first power signal line, or (ii) the light emitting element is electrically connected to the second terminal and the second power signal line;
    wherein the circuit layer comprises a binding layer away from the substrate;
    wherein electrically connecting the switching element and the light emitting element to the circuit layer comprises:
    binding and electrically connecting the switching element to the binding layer; and
    binding and electrically connecting the light emitting element to the binding layer;
    wherein the circuit layer further comprises a weld assisting layer, wherein the weld assisting layer is formed on one side of the binding layer facing away from the substrate; and
    wherein the manufacturing method further comprises:
    providing a resistor; and
    electrically connecting the resistor to the circuit layer, wherein the resistor and the light emitting element are electrically connected in series between the first power signal line and the second power signal line.

2. The manufacturing method of claim 1, wherein electrically connecting the switching element and the light emitting element to the circuit layer further comprises:
    electrically connecting the at least one switching element and the at least one light emitting element to the circuit layer through a transfer technique.

3. The manufacturing method of claim 1, wherein the circuit layer further comprises at least one metal layer, and the at least metal layer is formed between the binding layer and the substrate; and
    wherein each of the first power signal line, the second power signal line, and the pulse width modulation signal line is formed in any one of the at least one metal layer.

4. The manufacturing method claim 3, further comprising:
    disposing a protection layer, wherein the protection layer is either the binding layer, the at least one metal layer in contact with the binding layer, or an additional layer between the binding layer and the at least one metal layer.

5. The manufacturing method of claim 1, wherein at least one of the first power signal line, the second power signal line, and the pulse width modulation signal line, plus the resistor use a same material and are formed in a same process.

6. A light emitting device, wherein the light emitting device comprises:
    a substrate;
    a circuit layer, formed on one side of the substrate, wherein the circuit layer comprises a first power signal line, a second power signal line, and a pulse width modulation signal line; and
    at least one switching element and at least one light emitting element, wherein the switching element and the light emitting element are electrically connected to the circuit layer;
    wherein the switching element comprises a control terminal, a first terminal, and a second terminal;
    wherein the control terminal is electrically connected to the pulse width modulation signal line;
    wherein the first terminal is electrically connected to the first power signal line, and the second terminal is electrically connected to the second power signal line;
    wherein (i) the light emitting element is electrically connected to the first terminal and the first power signal line, or (ii) the light emitting element is electrically connected to the second terminal and the second power signal line;
    wherein at least one of the first power signal line and the second power signal line is wired in a grid;
    wherein a vertical projection of the grid on the substrate surrounds a vertical projection on the substrate of the switching element and the light emitting element electrically connected to the switching element;
    wherein the light emitting device further comprises: a resistor, the resistor is electrically connected to the circuit layer; and
    wherein the resistor and the light emitting element are electrically connected in series to both the first power signal line and the second power signal line.

7. The light emitting device of claim 6, wherein either the first power signal line or the second power signal line is used for transmitting a first potential, and another one of the first power signal line and the second power signal line is used for transmitting a second potential; and wherein the first potential is equal to or greater than a threshold voltage of the light emitting element, and the second potential is equal to a zero potential.

8. The light emitting device of claim 6, wherein the circuit layer comprises a binding layer facing away from the substrate, and the switching element and the light emitting element are electrically connected to the binding layer.

9. The light emitting device of claim 8, wherein the circuit layer further comprises at least one metal layer, and the at least one metal layer is disposed between the substrate and the binding layer; and
   each of the first power signal line, the second power signal line, and the pulse width modulation signal line is disposed in any one of the at least one metal layer.

10. The light emitting device of claim 9, wherein the circuit layer further comprises a protective layer, wherein the protection layer is either the binding layer, the at least one metal layer in contact with the binding layer, or an additional layer between the binding layer and the at least one metal layer.

11. The light emitting device of claim 6, wherein the substrate comprises a connecting via; and
   wherein one of the switching element or the light emitting element is disposed on one side of the circuit layer away from the substrate, wherein another switch element or the light emitting element is disposed on one side of the substrate away from the circuit layer, and is electrically connected to the circuit layer through the connecting via.

12. The light emitting device of claim 6, further comprising:
   a drive circuit, wherein the drive circuit is disposed on an edge of one side of the light emitting device; wherein the first power signal line, the second power signal line, and the pulse width modulation signal line each is electrically connected to the drive circuit; and
   wherein the resistor comprises a first resistor and a second resistor, wherein the first resistor is disposed on one side of the second resistor closer to the drive circuit;
   wherein a resistance value of the first resistor is R, which meets a requirement as shown below:

$$R \geq \frac{(V + \Delta V)R0}{V \pm C \times R0},$$

wherein R0 is a resistance value of the second resistor, ΔV is a voltage drop on the first power signal line between the first resistor and the second resistor, V is a potential received by the second resistor, and a constant C is a difference value between a current flowing through the first resistor and a current flowing through the second resistor.

13. The light emitting device of claim 6, wherein the substrate comprises a light emitting region and a non-light emitting region surrounding the light emitting region;
   wherein the light emitting element and the switching element are disposed in the light emitting region;
   wherein the first power signal line, the second power signal line and the pulse width modulation signal line each extends into the non-light emitting region from the light emitting region;
   wherein the light emitting device further comprises at least two first connecting terminals which are disposed in the non-light emitting region and located on different sides of the light emitting region;
   wherein the first power signal line extending to a same side of the light emitting region is electrically connected to a same first connecting terminal among the at least two first connecting terminals, and the at least two first connecting terminals are electrically connected end to end in sequence;
   wherein the light emitting device further comprises at least two second connecting terminals which are disposed in the non-light emitting region and located on different sides of the light emitting region; and
   wherein the second power signal line extending to a same side of the light emitting region is electrically connected to a same second connecting terminal among the at least two second connecting terminals, and wherein the at least two second connecting terminals are electrically connected end to end in sequence.

* * * * *